United States Patent
Higashino et al.

(10) Patent No.: US 11,617,288 B2
(45) Date of Patent: Mar. 28, 2023

(54) FEEDER MANAGEMENT DEVICE AND COMPONENT-MOUNTING SYSTEM PROVIDED WITH SAME

(71) Applicant: YAMAHA HATSUDOKI KABUSHIKI KAISHA, Iwata (JP)

(72) Inventors: Masaki Higashino, Shizuoka (JP); Toshihiro Michizoe, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 398 days.

(21) Appl. No.: 16/758,367

(22) PCT Filed: Oct. 31, 2017

(86) PCT No.: PCT/JP2017/039320
§ 371 (c)(1),
(2) Date: Apr. 22, 2020

(87) PCT Pub. No.: WO2019/087296
PCT Pub. Date: May 9, 2019

(65) Prior Publication Data
US 2020/0344926 A1   Oct. 29, 2020

(51) Int. Cl.
*H05K 13/04*      (2006.01)
*H05K 13/08*      (2006.01)
(Continued)

(52) U.S. Cl.
CPC ......... *H05K 13/0419* (2018.08); *G06Q 10/06* (2013.01); *H05K 13/0215* (2018.08);
(Continued)

(58) Field of Classification Search
CPC .............. H05K 13/02; H05K 13/0215; H05K 13/0417; H05K 13/0419; H05K 13/085;
(Continued)

(56) References Cited

U.S. PATENT DOCUMENTS 6,971,161 B1   12/2005   Maenishi et al.
2004/0080897 A1*  4/2004  Kodama ............ H05K 13/0882
                                                    361/234
(Continued)

FOREIGN PATENT DOCUMENTS

CN       1630466 A       6/2005
JP     2014-027064 A     2/2014
(Continued)

OTHER PUBLICATIONS

An Office Action mailed by China National Intellectual Property Administration dated Sep. 27, 2020, which corresponds to Chinese Patent Application No. 201780096123.1 and is related to U.S. Appl. No. 16/758,367 with English language translation.
(Continued)

*Primary Examiner* — Peter Dungba Vo
*Assistant Examiner* — Joshua D Anderson
(74) *Attorney, Agent, or Firm* — Studebaker & Brackett PC

(57) ABSTRACT

The feeder management device is a device that manages selection of a tape feeder to be set at each set position defined for each component in a component feeding unit of a component-mounting device. The feeder management device includes a memory unit and a feeder selection management unit. The memory unit stores list information indicating, for each component, whether or not to use a tape feeder of a special type among a plurality of tape feeders different in method of supplying the component storage tape, the tape feeder of the special type supplying the component storage tape easily. The feeder selection management unit refers to the list information stored in the memory unit, and manages selection of the tape feeder for each component, the selection corresponding to each set position in the component feeding unit of the component-mounting device.

20 Claims, 13 Drawing Sheets

(51) Int. Cl.
*H05K 13/02* (2006.01)
*G06Q 10/06* (2023.01)

(52) U.S. Cl.
CPC ....... *H05K 13/0417* (2013.01); *H05K 13/085* (2018.08); *H05K 13/086* (2018.08)

(58) Field of Classification Search
CPC ............... H05K 13/086; H05K 13/087; H05K 13/0882; Y10T 29/4913; Y10T 29/53174; Y10T 29/53178; G06Q 10/06
See application file for complete search history.

(56) References Cited

U.S. PATENT DOCUMENTS

| | | |
|---|---|---|
| 2005/0165505 A1 | 7/2005 | Moriya et al. |
| 2006/0100732 A1 | 5/2006 | Bollinger |
| 2010/0325860 A1* | 12/2010 | Maenishi ............. H05K 13/085 29/407.01 |
| 2018/0049354 A1 | 2/2018 | Honda et al. |
| 2019/0191603 A1 | 6/2019 | Honda et al. |

FOREIGN PATENT DOCUMENTS

| | | |
|---|---|---|
| WO | 01/24597 A1 | 4/2001 |
| WO | 2016/142989 A1 | 9/2016 |

OTHER PUBLICATIONS

International Search Report issued in PCT/JP2017/039320; dated Jan. 16, 2018.

* cited by examiner

FIG. 8

| COMPONENT NAME | ALF USE PERMISSION/ NON-PERMISSION | RECOMMENDED SIZE | USABLE SIZE | SPECIFIED SIZE |
|---|---|---|---|---|
| SP1 | USE IS PERMITTED | S | S | — |
| SP2 | USE IS PERMITTED | S | S/M | — |
| SP3 | USE IS PERMITTED | S | S/M | S |
| SP4 | USE IS PERMITTED | M | M/L | L |
| SP5 | USE IS PERMITTED | L | M/L/LL | L/LL |
| A1 | USE IS NOT PERMITTED | — | — | — |
| A2 | USE IS NOT PERMITTED | — | — | — |

FEEDER MANAGEMENT DEVICE AND COMPONENT-MOUNTING SYSTEM PROVIDED WITH SAME

CROSS-REFERENCE TO RELATED APPLICATION

This application is a National Stage of International Patent Application No. PCT/JP2017/039320, filed Oct. 31, 2017, the entire content of which is incorporated herein by reference.

BACKGROUND

Technical Field

The present disclosure relates to a feeder management device that manages selection of a tape feeder to be arranged in a component feeding unit of a component-mounting device, and a component-mounting system provided with the feeder management device.

Background Art

A component-mounting device having tape feeders is known as a component-mounting device that mounts (packages) electronic components (hereinafter simply referred to as "components") on a board, such as printed wiring board, to produce a component-mounting board. A tape feeder intermittently sends off a component storage tape carrying components, from a reel wound with the component storage tape, to transfer the components to a given component take-out position. In a component feeding unit of the component-mounting device, a plurality of tape feeders are arranged in a row. Components fed by these tape feeders are picked by a holder of a component mounting head, and are mounted on the board.

For production of the component-mounting board by the component-mounting device, an operator carries out pre-arrangement work, such as fitting a component storage tape carrying components needed for the production to a tape feeder and setting the tape feeder at a set position defined for each component in the component feeding unit of the component-mounting device, and thereafter the production starts. To produce the component-mounting board, a plurality of types of components different in size are used. For this reason, when carrying out pre-arrangement work, the operator needs to set a tape feeder suitable for component feeding at each set position. For example, WO 01/24597 A discloses a technique for selecting a tape feeder to be set in a component feeding unit of a component-mounting device. According to the technique disclosed in WO 01/24597 A, arrangement of tape feeders is determined according to a condition, such as a limit on the number of tape feeders.

Meanwhile, there are various tape feeders different in method of supplying the component storage tape. Tape feeders include, for example, tape feeders adopting a splicing tape supply method and tape feeders adopting splicing-less tape supply method (autoloading tape supply method).

In the case of a tape feeder adopting the splicing tape supply method, when a preceding component storage tape, which feeds components first, comes to have a little portion left to send off, the operator carries out component supply work of splicing a component storage tape for replenishment to a rear end of the preceding component storage tape.

In the case of a tape feeder adopting the autoloading tape supply method, in contrast, when a front end of the tape is set at a given position in advance, the tape can be automatically loaded onto the component take-out position by operating a button. If a front end of the component storage tape for replenishment is set at the given position in advance, the component storage tape for replenishment is automatically loaded onto the component take-out position after the preceding component storage tape is entirely sent off. Thus, the component storage tape for replenishment starts its intermittent send-off action. In this manner, the tape feeder adopting the autoloading tape supply method spares the operator cumbersome tape charging work or tape splicing work, thus improving the efficiency of so-called tape feeder pre-arrangement work and component supply work. Thus, the tape feeder adopting the autoloading tape supply method makes supply of the component storage tape easier than supply of the component storage tape carried out at the tape feeder adopting the splicing tape supply method.

In a state in which, as described above, various tape feeders different in method of supplying the component storage tape are present together, it is necessary to select a tape feeder while taking account of the efficiency of component supply work for each component. Not taking account of the efficiency of component supply work for each component impairs the smoothness of the operator's component supply work on the tape feeder. As a result, a delay in component supply work causes component feeding from the tape feeder to stop, raising a concern that the efficiency of production of the component-mounting board drops.

SUMMARY

The present disclosure has been conceived in view of the above circumstances, and therefore provides a feeder management device that, in a state in which various tape feeders different in method of supplying a component storage tape are present together, manages selection of a tape feeder that allows an operator to smoothly carry out component supply work, and to provide a component-mounting system provided with the feeder management device.

A feeder management device according to one aspect of the present disclosure is a device that manages selection of a tape feeder that feeds components stored in a component storage tape, the tape feeder being to be set at each set position defined for each component in a component feeding unit of a component-mounting device that mounts components on a board to produce a component-mounting board. The feeder management device includes a memory unit that stores list information indicating, for each component, whether or not to use a tape feeder of a special type among a plurality of tape feeders different in method of supplying a component storage tape, the tape feeder of the special type supplying the component storage tape easily; and a feeder selection management unit that, referring to the list information, manages selection of a tape feeder for each component, the selection corresponding to each set position.

A component-mounting system according to another aspect of the present disclosure includes a component-mounting device having a component feeding unit in which a set position of a tape feeder is defined for each component, the tape feeder feeding components stored in a component storage tape; and the above feeder management device that manages selection of a tape feeder to be set at each set position.

The object, features, and advantages of the present disclosure will be clarified through the following detailed description and reference to the accompanying drawings.

BRIEF DESCRIPTION OF THE DRAWINGS

FIG. 8 is a diagram for describing list information stored in a memory unit of the feeder management device;

DETAILED DESCRIPTION

A feeder management device and a component-mounting system according to an embodiment of the present disclosure will now be described with reference to drawings.

[Overall Configuration of Component-Mounting System]

Figure 1:
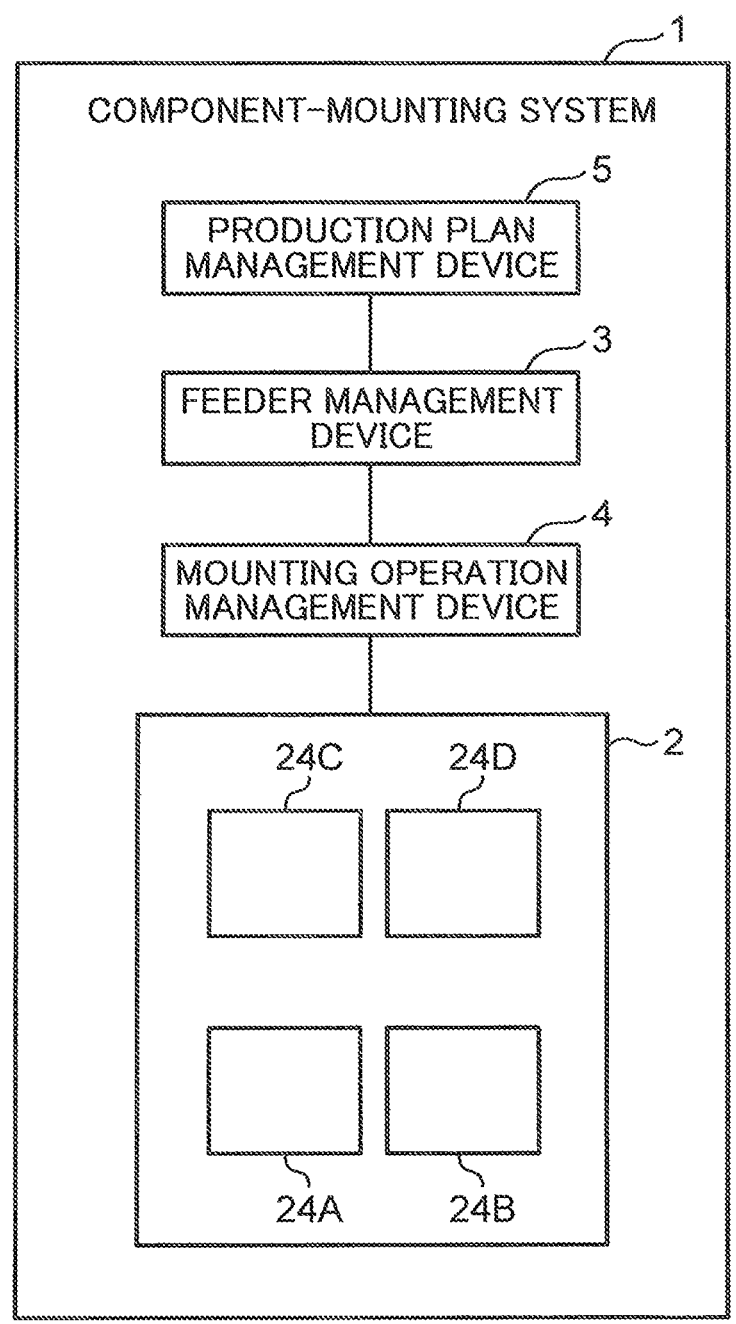
FIG. 1 is a schematic view of a configuration of a component-mounting system including a feeder management device according to a first embodiment of the present disclosure.

FIG. 1 is a schematic view of a configuration of a component-mounting system 1 according to one embodiment of the present disclosure. The component-mounting system 1 includes component-mounting devices 2, a feeder management device 3, a mounting operation management device 4, and a production plan management device 5. In the component-mounting system 1, the mounting operation management device 4 and the production plan management device 5 are management devices that are connected to the feeder management device 3 in such a way as to carry out data communication with the management device 3 and that manage production of component-mounting boards by the component-mounting devices 2.

<Configuration of Component-Mounting Device>

Figure 2:
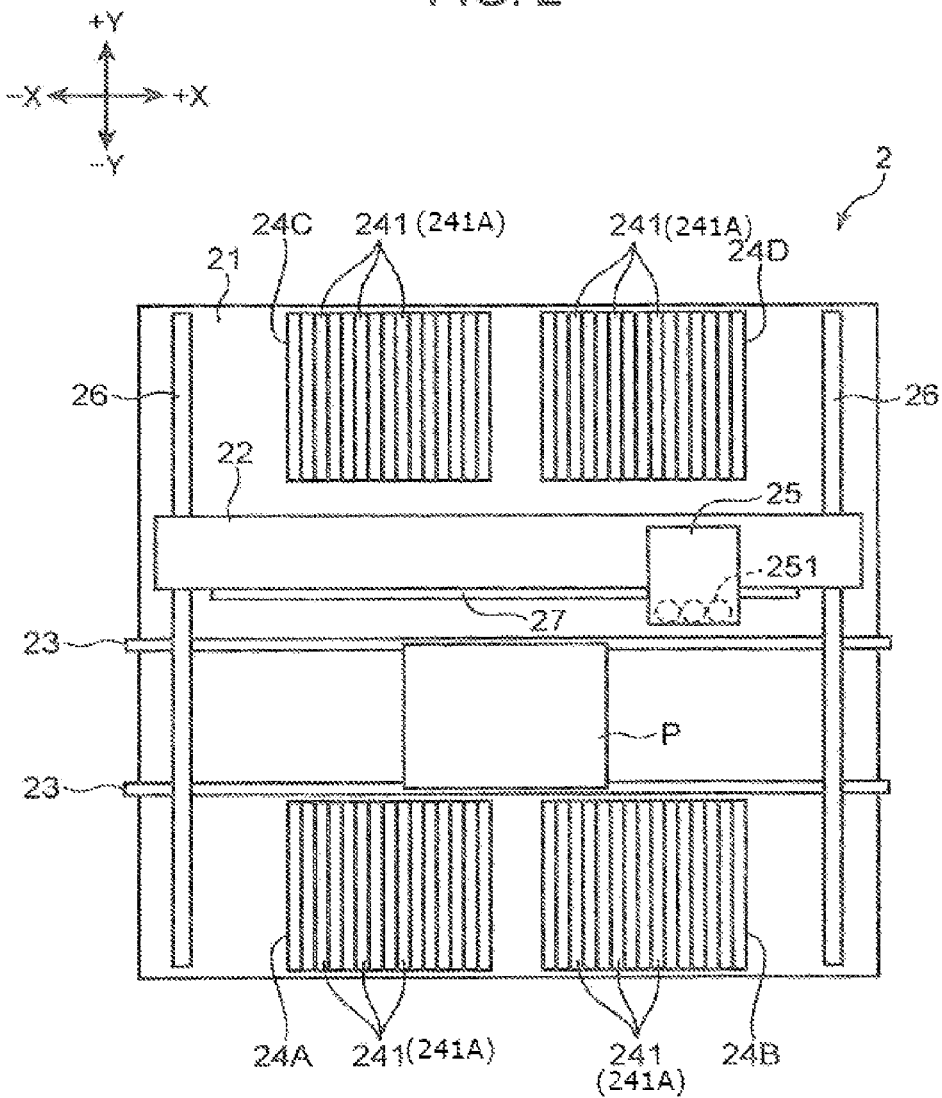
FIG. 2 is a plan view of a configuration of a component-mounting device included in the component-mounting system.

A configuration of the component-mounting device 2 will first be described with reference to FIG. 2. FIG. 2 is a plan view of the configuration of the component-mounting device 2. In the following description, directional relationships will be described using the X and Y rectangular coordinate axes. One side of the X-axis direction is referred to as "+X-side", and the other side of the same that is opposite to the one side is referred to as "−X-side". One side of the Y-axis direction is referred to as "+Y-side", and the other side of the same that is opposite to the one side is referred to as "−Y-side".

The component-mounting device 2 is a device that mounts components on a board P to produce a component-mounting board. The component-mounting device 2 includes a body frame 21, a mobile frame 22, conveyors 23, component feeding units 24A, 24B, 24C, and 24D, a head unit 25, first drive mechanisms 26, and a second drive mechanism 27.

The body frame 2 is a structure in which units making up the component-mounting device 2 are arranged. The body frame 2 is formed into a substantially rectangular shape in a plan view in a direction perpendicular to the X-axis direction and the Y-axis direction. The conveyors 23 extend in the X-axis direction and are arranged in the body frame 21. The conveyors 23 transfer the board P in the X-axis direction. The board P on the conveyors 23 is transferred by the conveyors 23 to a given work location (component mounting location where a component is mounted on the board P), where the board P is positioned.

The component feeding units 24A, 24B, 24C, and 24D are arranged respectively in four locations in the body frame 21 such that a pair of them are arranged in a row in the X-axis direction in an area on the +Y-side in the Y-axis direction while the other pair of them are arranged in a row in the X-axis direction in an area on the −Y-side in the Y-axis direction. In FIG. 2, the component feeding unit located on the −X-side in the area on the −Y-side in the Y-axis direction of the body frame 21 is indicated as "component feeding unit 24A" while the component feeding unit located on the +X-side in the same area is indicated as "component feeding unit 24B". Likewise, the component feeding unit located on the −X-side in the area on the +Y-side in the Y-axis direction is indicated as "component feeding unit 24C" while the component feeding unit located on the +X-side in the same area is indicated as "component feeding unit 24D". In the body frame 21, the component feeding units 24A, 24B, 24C, and 24D serve as areas in which a plurality of tape feeders 241 arranged in a row are fitted. In each of the component feeding units 24A, 24B, 24C, and 24D, a set position of each tape feeder 241 is defined for each component to be sucked and held by a suction nozzle 251 that is a holder attached to a head unit 25, which will be described later.

The tape feeder 241 is a feeder configured such that a component storage tape carrying components stored at given intervals is wound around a reel and is sent off from the reel. The tape feeder 241 is fitted removably to the component feeding units 24A, 24B, 24C, and 24D of the body frame 21, and sends off the component storage tape, thereby feeding components stored in the component storage tape to the suction nozzle 251 of the head unit 25.

The tape feeders 241 arranged in a row in the component feeding units 24A, 24B, 24C, and 24D of the component-mounting device 2 are various tape feeders different in method of supplying the component storage tape. For example, there exist tape feeders that adopt a first supply method, i.e., autoloading tape supply method and tape feeders that adopt a second supply method, i.e., splicing tape supply method.

A tape feeder adopting the first supply method, i.e., autoloading tape supply method is configured to be fitted with a plurality of component storage tapes, which are a preceding component storage tape that feeds components first and a component storage tape for replenishment that feeds components following completion of component feeding by the preceding component storage tape. More specifically, the tape feeder adopting the first supply method is configured to be fitted with a plurality of reels wound with component storage tapes, respectively, and is provided with a tape guide 244 having a component feeding opening, which defines a component feeding position for feeding a component to the suction nozzle 251, and a component exposing portion. This tape guide 244 will be described later. According to the tape feeder adopting the first supply method, when the preceding component storage tape is completely sent off from the reel, the component storage tape for replenishment is automatically sent off from the reel. Because a plurality of reels (component storage tape) can be fitted to the tape feeder adopting the first supply method, a point of time of supplying the reel wound with the component storage tape for replenishment is not limited to a point of time at which the preceding component storage tape is sent off completely from the reel around which the preceding component storage tape has been wound, but is given a degree of freedom. The tape feeder adopting the first supply method thus saves an operator cumbersome tape charging work or tape splicing work, allowing an improvement in the efficiency of so-called tape feeder pre-arrangement work and component supply work. In the following description, the tape feeder adopting the first supply method, i.e., autoloading tape supply method (autoloading tape feeder or ALF) will be referred to as "first tape feeder 241". This first tape feeder 241 will be described in detail later.

The tape feeder adopting the second supply method, i.e., splicing tape supply method, on the other hand, is configured to be fitted with one reel. According to the tape feeder adopting the second supply method, at a point of time at which a preceding component storage tape is sent off completely from the one reel fitted to the tape feeder, transition from the preceding component storage tape to a component storage tape for replenishment is performed. For this reason, a rear end of the preceding component storage tape is spliced to a front end of the component storage tape for replenishment by pasting a splicing tape or the like on a part where both ends join. According to the tape feeder adopting the second supply method, at a point of time at which the preceding component storage tape is sent off completely from the one reel, splicing work of pasting the splicing tape or the like is carried out (work for splicing). A point of time of supplying a reel wound with the component storage tape for replenishment is, therefore, limited to the point of time at which the preceding component storage tape is sent off completely. In the following description, the tape feeder adopting the second supply method, i.e., splicing tape supply method will be referred to as "second tape feeder 241A; non-ALF" in order to distinguish the tape feeder adopting the splicing tape supply method from the first tape feeder 241 that is an ALF.

The mobile frame 22 of the component-mounting device 2 extends in the X-axis direction, and is supported by the body frame 21 such that the mobile frame 22 is allowed to move in a given direction (Y-axis direction). The mobile frame 22 carries the head unit 25. The head unit 25 is mounted on the mobile frame 22 such that the head unit 25 is allowed to move in the X-axis direction. In other words, the head unit 25 can be moved in the Y-axis direction as a result of movement of the mobile frame 22 in the Y-axis direction and can independently move in the X-axis direction along the mobile frame 22. The head unit 25 can move between each of tape feeders 241 (241A) arranged in a row in the component feeding units 24A, 24B, 24C, and 24D and the given work location to which the board P is transferred by the conveyors 23. The head unit 25 takes out a component from the tape feeder and mounts (packages) the taken out component on the board P.

The head unit 25 has the suction nozzle 251, which is a holder capable of sucking and holding the component to be mounted on the board P. The suction nozzle 251 can communicate with any one of a negative pressure generation device, a positive pressure generation device, and the fresh air, via an electric selector valve. Specifically, supplying a negative pressure to the suction nozzle 251 allows it to suck and hold the component (to take out the component). Afterward, supplying a positive pressure to the suction nozzle 251 causes it to release the component. According to this embodiment, a holder different from the suction nozzle 251 may be adopted. For example, a chuck that grips and holds a component may be used in place of the suction nozzle 251.

The first drive mechanisms 26 of the component-mounting device 2 are disposed on a +X-side end and a −X-side end of the body frame 21, respectively. The first drive mechanisms 26 are mechanisms that move the mobile frame 22 in the Y-axis direction. Each of the first drive mechanisms 26 includes, for example, a drive motor, a ball screw shaft extending in the Y-axis direction and connected to the drive motor, and a ball nut disposed on the mobile frame 22 and screwed on the ball screw shaft. According to the first drive mechanism 26 configured in this manner, as a result of the rotation of the ball screw shaft caused by the drive motor, the ball nut moves back and forth along the ball screw shaft, which causes the mobile frame 22 to move in the Y-axis direction.

The second drive mechanism 27 of the component-mounting device 2 is disposed on the mobile frame 22. The second drive mechanism 27 is a mechanism that moves the head unit 25 in the X-axis direction along the mobile frame 22. Similar to the first drive mechanism 26, the second drive mechanism 27 includes, for example, a drive motor, a ball screw shaft extending in the X-axis direction and connected to the drive motor, and a ball nut disposed on the head unit 25 and screwed on the ball screw shaft. According to the second drive mechanism 27 configured in this manner, as a result of the rotation of the ball screw shaft caused by the drive motor, the ball nut moves back and forth along the ball screw shaft, which causes the head unit 25 to move in the X-axis direction.

<Configuration of First Tape Feeder>

Figure 3:
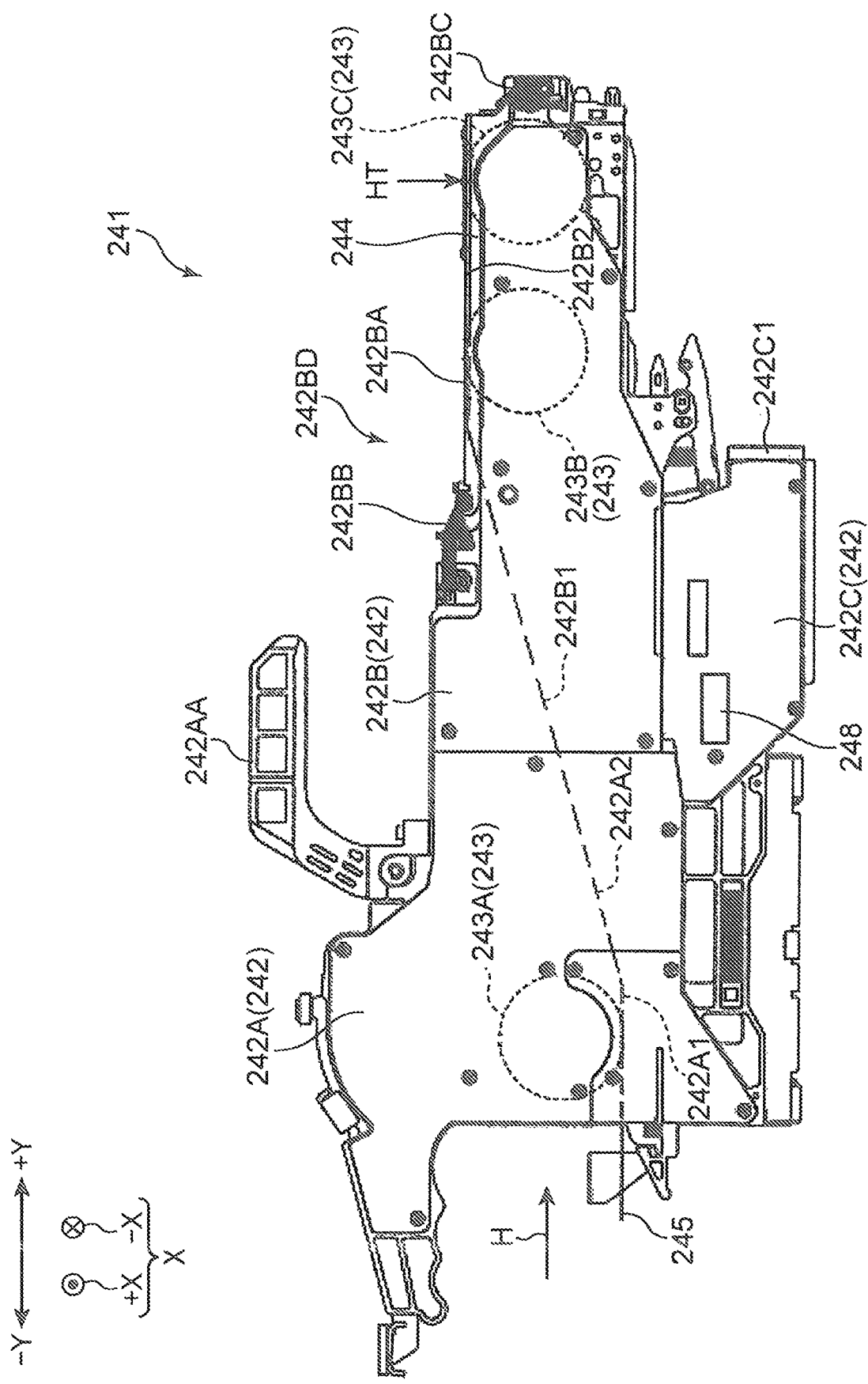
FIG. 3 depicts a configuration of a first tape feeder included in the component-mounting device.
Figure 4:
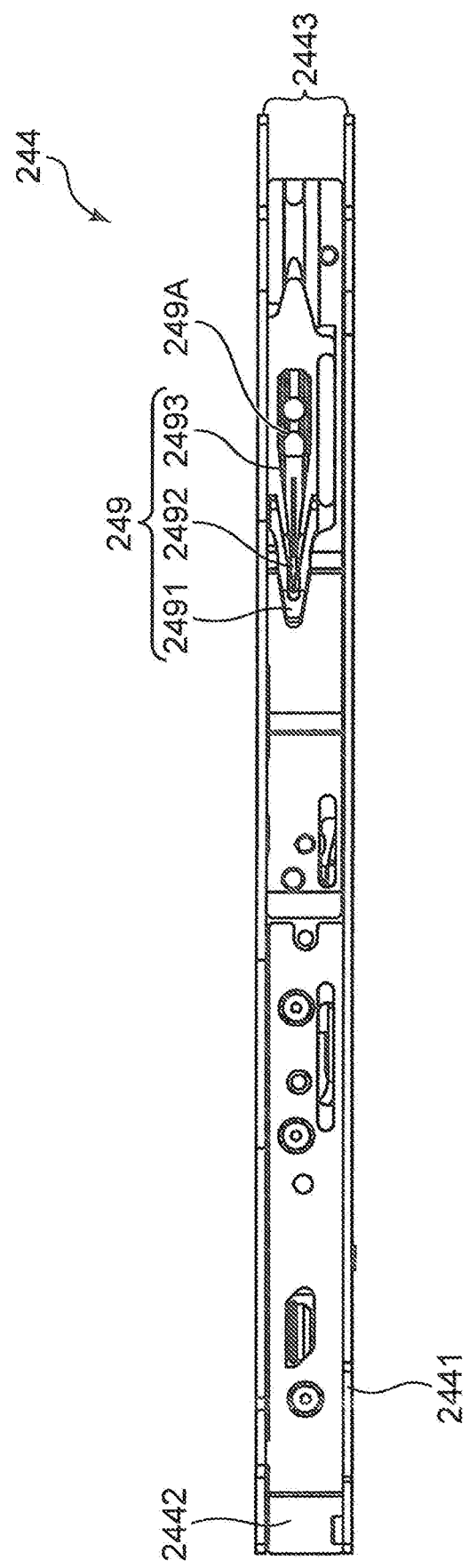
FIG. 4 depicts a configuration of a tape guide included in the first tape feeder.
Figure 5:
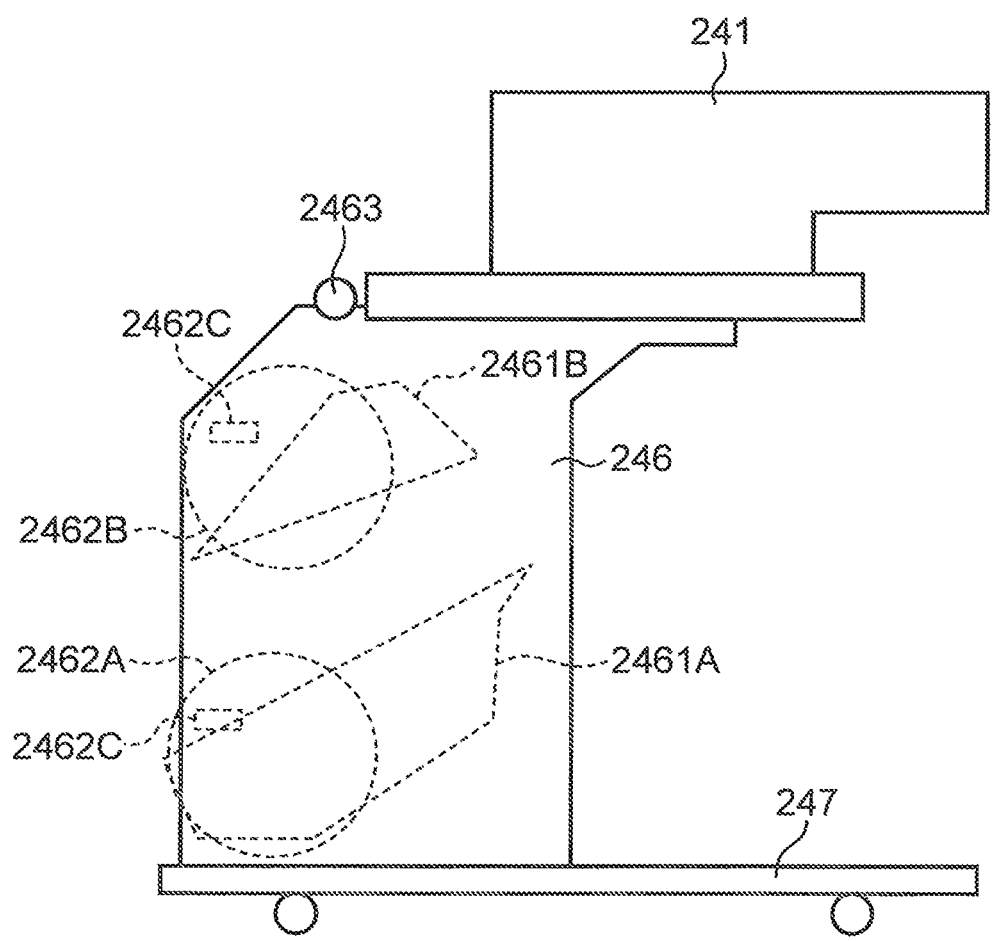
FIG. 5 depicts the first tape feeder in a state of being fitted with reels.
Figure 6:
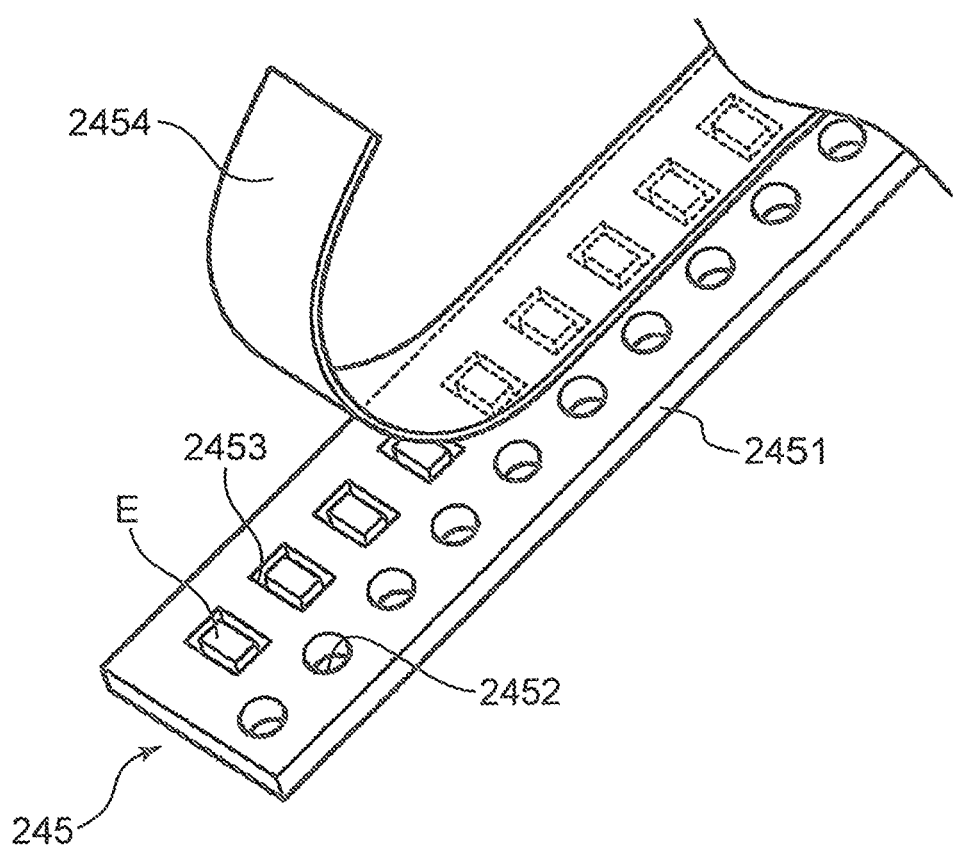
FIG. 6 is a perspective view of a component storage tape wound around a reel.

A configuration of the first tape feeder 241 (ALF) adopting the first supply method will be described in detail with reference to FIGS. 3 to 6. FIG. 3 depicts the configuration of the first tape feeder 241. FIG. 4 depicts a configuration of the tape guide 244 included in the first tape feeder 241. FIG. 5 depicts the first tape feeder 241 in a state of being fitted with reels. FIG. 6 is a perspective view of a component storage tape 245 wound around a reel.

Before description of the configuration of the first tape feeder 241, the component storage tape 245 will be described first with reference to FIG. 6. The component storage tape 245 is made up of a carrier tape 2451 and a cover tape 2454. The carrier tape 2451 is a tape having a plurality of component storage portions 2453 storing components E therein, the component storage portions 2453 being arranged at given intervals. The carrier tape 2451 has transfer force transmission holes 2452 arranged at given intervals on one end in the width direction of the carrier tape 2451, the transfer force transmission holes 2452 engaging with teeth of a first sprocket 243A, a second sprocket 243B, and a third sprocket 243C of the first tape feeder 241, which first, second, and third sprockets 243A, 243B, and 243C will be described later, and receiving a transfer force for sending out the component storage tape 245, the transfer force being transmitted to the transfer force transmission holes 2452 by the first sprocket 243A, the second sprocket 243B, and the third sprocket 243C. The cover tape 2454 is a tape pasted on the carrier tape 2451 in such a way as to cover the component storage portions 2453.

As shown in FIG. 3, the first tape feeder 241 includes a feeder body 242, a tape send-off unit 243, and a tape guide 244. The feeder body 242 makes up an outer shell of the first tape feeder 241, and includes a first housing portion 242A, a second housing portion 242B, and a third housing portion 242C. The first housing portion 242A is disposed on the −Y-side in the Y-axis direction of the feeder body 242, and is formed as a box with a small width. Inside the first housing portion 242A, a first tape traveling path 242A1 extending horizontally in the Y-axis direction and a second tape traveling path 242A2 extending upward slantly from a +Y-side end of the first tape traveling path 242A1 are formed. The component storage tape 245 is taken into the first tape feeder 241 along the first tape traveling path 242A1 of the first housing portion 242A, travels through the first tape traveling path 242A1, and then travels on the second tape traveling path 242A2. On an upper surface of the first housing portion 242A, a handle 242AA that is used to carry the first tape feeder 241 is disposed.

The second housing portion 242B is coupled to a +Y-side end of the first housing portion 242A, and is formed as a box with the same width as that of the first housing portion 242A. Inside the second housing portion 242B, a third tape traveling path 242B1 is formed, the third tape traveling path 242B1 extending upward slantly in the same manner as the second tape traveling path 242A2, from a +Y-side end of the second tape traveling path 242A2 to reach an upper surface 242BA of the second housing portion 242B. From a +Y-side end of the third tape traveling path 242B1, the upper surface 242BA of the second housing portion 242B extends horizontally toward the +Y-side along the Y-axis direction to define a fourth tape traveling path 242B2. A component feeding position HT is set on a +Y-side end of the fourth tape traveling path 242B2. The component storage tape 245 travels through the first tape traveling path 242A1 and the second tape traveling path 242A2, and then travels through the third tape traveling path 242B1 and the fourth tape traveling path 242B2 in order to finally reach the component feeding position HT. Respective widths of the first tape traveling path 242A1, the second tape traveling path 242A2, the third tape traveling path 242B1, and the fourth tape traveling path 242B2 are determined to be the same.

On the second housing portion 242B, an area where the upper surface 242BA defining the fourth tape traveling path 242B2 is located serves as a tape guide fitting area 242BD to which the tape guide 244, which will be described later, is fitted. In other words, the tape guide fitting area 242BD has the upper surface 242BA defining the fourth tape traveling path 242B2. On the second housing portion 242B, a first holding portion 242BB and a second holding portion 242BC are disposed in the tape guide fitting area 242BD, the first holding portion 242BB and the second holding portion 242BC holding the tape guide 244 fitted to the tape guide fitting area 242BD. The first holding portion 242BB holds a −Y-side of the tape guide 244 while the second holding portion 242BC holds a +Y-side of the tape guide 244.

The third housing portion 242C is coupled to a lower end of the second housing portion 242B, and is formed as a box with the same width as that of the second housing portion 242B. The third housing portion 242C houses a control board for controlling an operation of the first tape feeder 241. To a +Y-side end of the third housing portion 242C, a connector 242C1 is attached. The connector 242C1 is supplied with power and various control signals from the component-mounting device 2.

The tape send-off unit 243 is disposed in the feeder body 242, and sends off the component storage tape 245 in a tape send-off direction H along the direction of arrangement of the component storage portions 2453, toward the component feeding position HT. The tape send-off direction H is a direction of heading from the −Y-side toward the +Y-side in the Y-axis direction. As shown in FIG. 3, the tape send-off unit 243 includes the first sprocket 243A, the second sprocket 243B, and the third sprocket 243C.

The first sprocket 243A is a disc-shaped sprocket that is supported in the first housing portion 242A in such a way as to be capable of rotating around an axis extending in the X-axis direction. The first sprocket 243A has a plurality of teeth arranged circumferentially at given intervals. The teeth of the first sprocket 243A can be fitted respectively in the transfer force transmission holes 2452 formed on the carrier tape 2451 of the component storage tape 245. Rotation of the first sprocket 243A sends off the component storage tape 245 including the carrier tape 2451 having the transfer force transmission holes 2452 engaged with the teeth of the first sprocket 243A.

The second sprocket 243B is a disc-shaped sprocket that is supported in the second housing portion 242B in such a way as to be capable of rotating around an axis extending in the X-axis direction. The second sprocket 243B has a plurality of teeth arranged circumferentially at given intervals. The teeth of the second sprocket 243B can be fitted respectively in the transfer force transmission holes 2452 formed on the carrier tape 2451 of the component storage tape 245. In the second housing portion 242B, the second sprocket 243B is located on an upstream side in the tape send-off direction H of the tape guide fitting area 242BD. The second sprocket 243B receives the component storage tape 245 having been sent off from the first sprocket 243A and traveled through the first tape traveling path 242A1 and the second tape traveling path 242A2 to travel on the third tape traveling path 242B1 and sends off the component storage tape 245 toward the component feeding position HT. The second sprocket 243B thus causes the component storage tape 245 to travel on the fourth tape traveling path 242B2.

The third sprocket 243C is a disc-shaped sprocket that is supported in the second housing portion 242B in such a way as to be capable of rotating around an axis extending in the X-axis direction. The third sprocket 243C has a plurality of teeth arranged circumferentially at given intervals. The teeth of the third sprocket 243C can be fitted respectively in the transfer force transmission holes 2452 formed on the carrier tape 2451 of the component storage tape 245. In the second housing portion 242B, the third sprocket 243C is located on a downstream side in the tape send-off direction HA of the tape guide fitting area 242BD. This means that the third sprocket 243C is located at a position that matches the component feeding position HT in the tape send-off direction H. The third sprocket 243C receives the component storage tape 245 having been sent off from the second sprocket 243B to travel on the fourth tape traveling path 242B2 and sends off the component storage tape 245 in such a way as to cause it to pass through the component feeding position HT. Thus, in a configuration in which the third sprocket 243C is located at the position that matches the component feeding position HT in the tape send-off direction H and receives the component storage tape 245 at that position, the component storage tape 245 can be sent off in a state in which the component storage tape 245 is positioned highly precisely relative to the component feeding position HT.

The tape guide 244 included in the first tape feeder 241 will then be described with reference to FIGS. 3 and 4. The tape guide 244, which is a long and narrow member extending in the Y-axis direction, is fitted to the tape guide fitting area 242BD of the second housing portion 242B of the feeder body 242. The width of the tape guide 244 is determined to be the same as that of the second housing portion 242B. The tape guide 244 guides the component storage tape 245, which is sent off by the second sprocket 243B and the third sprocket 243C, when the component storage tape 245 travels on the fourth tape traveling path 242B2. According to this embodiment, the tape guide 244 is fitted to the tape guide fitting area 242BD in such a way as to cover the upper surface 242BA of the tape guide fitting area 242BD of the second housing portion 242B from above the upper surface 242BA.

The tape guide 244 includes a guide body 2441, a first locking portion 2442, and a second locking portion 2443. The guide body 2441 makes up an outer shell of the tape guide 244. In a state in which the tape guide 244 is fitted to the tape guide fitting area 242BD of the second housing portion 242B, the guide body 2441 covers the upper surface 242BA of the tape guide fitting area 242BD from above. The guide body 2441 and the upper surface 242BA of the tape guide fitting area 242BD of the second housing portion 242B jointly define the fourth tape traveling path 242B2.

As shown in FIG. 4, the guide body 2441 has a component feeding opening 249A that, on the first tape feeder 241, defines the component feeding position HT of the component E relative to the suction nozzle 251. To put it another way, the first tape feeder 241 has the component supply opening 249A formed on the guide body 2441 of the tape guide 244.

As shown in FIG. 4, the guide body 2441 is fitted with a component exposing portion 249. The component exposing portion 249 exposes the component E in the component storage portion 2453 of the component storage tape 245, which is guided by the tape guide 244 and travels on the fourth tape traveling path 242B2. The component exposing portion 249 includes an insertion portion 2491, a blade 2492, and a cover tape post-processing portion 2493.

On the component exposing portion 249, the insertion portion 2491 is a thin plate-like portion of a tapered shape. The insertion portion 2491 is inserted between the carrier tape 2451 and the cover tape 2454 of the component storage tape 245, which is sent off by the second sprocket 243B and travels on the fourth tape traveling path 242B2 as a front end of the component storage tape 245 is kept free. On the component exposing portion 249, the blade 2492 is located on the downstream side in the tape send-off direction H relative to the insertion portion 2491, and cuts the cover tape 2454 along a straight line in the tape send-off direction H as the component storage tape 245 travels. On the component exposing portion 249, the cover tape post-processing portion 2493 is located on the downstream side in the tape send-off direction H relative to the blade 2492, and carries out a process of pushing and spreading out the cover tape 2454 cut by the blade 2492. This exposes the component E in the component storage portion 2453 of the component storage tape 245. Thus, the component E, which is exposed in the component storage portion 2453 at the component feeding position HT, is sucked and taken out by the suction nozzle 251 of the head unit 25 of the component-mounting device 2 through the component supply opening 249A.

On the tape guide 244, the first locking portion 2442 is located on a −Y-side end of the guide body 2441. The first locking portion 2442 is locked onto the first holding portion 242BB in the tape guide fitting area 242BD of the second housing portion 242B. As a result, a −Y-side end of the tape guide 244 is held by a −Y-side end of the tape guide fitting area 242BD. On the tape guide 244, the second locking portion 2443 is located on a +Y-side end of the guide body 2441. The second locking portion 2443 is locked onto the second holding portion 242BC in the tape guide fitting area 242BD of the second housing portion 242B. As a result, a +Y-side end of the tape guide 244 is held by a +Y-side end of the tape guide fitting area 242BD.

To a side surface of the first tape feeder 241, a first recording portion 248 (see FIG. 3) is attached. The first recording portion 248 records feeder information for identifying the first tape feeder 241 that is fitted in the component feeding units 24A, 24B, 24C, and 24D. The feeder information recorded on the first recording portion 248 is information that associates feeder identifying information for identifying the first tape feeder 241 with tape guide size information on the size of the tape guide 244. The tape guide size information includes recommended size information and usable size information. The size of the tape guide 244 is determined to be a proper size by taking account of the size of the component, the width of the component storage tape 245, an extent of spreading of the cut cover tape 2454 by the cover tape post-processing portion 2493, and the like. These pieces of information on the size of the tape guide 244 make up the tape guide size information. The recommended size information is information on the size of a tape guide 244 recommended to be used. The recommended size information indicates the size of the tape guide 244, as one size associated with one component. The usable size information is information on the size of a tape guide 244 that can be used. The usable size information indicates the size of the tape guide 244, as one or a plurality of sizes associated with one component. The first recording portion 248 is provided as, for example, a bar code carrying encoded feeder information. When setting the first tape feeder 241 at each set position defined for each component in the component feeding units 24A, 24B, 24C, and 24D, the operator reads the first recording portion 248 attached to the first tape feeder 241, using a reading device, such as a bar code reader. Similarly, to a side surface of the second tape feeder 241A (non-ALF), which is different from the first tape feeder 241, a recording portion carrying feeder information for identifying the second tape feeder 241A is attached. It should be noted, however, that because the second tape feeder 241A has no tape guide 244, the feeder information recorded on the recording portion attached to the second tape feeder 241A does not include the tape guide size information on the size of the tape guide 244.

A shown in FIG. 5, under each of a plurality of tape feeders including the first tape feeders 241, a reel support 246 supported by a truck 247 is disposed. The reel support 246 supports a first reel holder 2461A and a second reel holder 2461B in such a way as to keep them separated from each other in the vertical direction. The first reel holder 2461A and the second reel holder 2461B hold a first reel 2462A and a second reel 2462B, respectively, in such a way as to allow them to rotate, the first reel 2462A and the second reel 2462B being wound with component storage tapes 245, respectively.

The component storage tape 245 wound around the first reel 2462A or the second reel 2462B is guided by a guide roller 2463 disposed on an upper end of the reel support 246 and therefore proceeds to the first sprocket 243A, the second sprocket 243B, and the third sprocket 243C. The component storage tape 245 having its transfer force transmission holes 2452 engaged with the teeth of the first sprocket 243A, the second sprocket 243B, and the third sprocket 243C is sent off as a result of rotation of the first sprocket 243A, the second sprocket 243B, and the third sprocket 243C.

On respective side surfaces of the first reel 2462A and the second reel 2462B, a second recording portion 2462C (see FIG. 5) is attached. The second recording portion 2462C carries readable component information including component identifying information for identifying components E stored in the component storage tapes 245 wound respectively around the first reel 2462A and the second reel 2462B, component type information relating to the type of components, number-of-components information relating to the number of components per reel, reel identifying information, and lot identifying information for identifying a reel lot. The second recording portion 2462C is provided as, for example, a bar code carrying encoded readable component information. When setting the component storage tape 245 on the first tape feeder 241, the operator reads the second recording portion 2462C attached to the first reel 2462A and the second reel 2462B, using a reading device, such as a bar code reader. Similarly, to a side surface of a reel fitted to the second tape feeder 241A, which is different from the first tape feeder 241, a recording portion carrying readable component information is attached.

<Component Feeding Operation of Tape Feeder>

[Component Feeding Operation of First Tape Feeder]

The first tape feeder 241 (ALF) adopting the first supply method, i.e., autoloading tape supply method carries out a component feeding operation in the following manner. As preparation work, the operator first attaches the first reel 2462A to the first reel holder 2461A held at a lower stage of the reel support 246, and fits a front end of the component storage tape 245 wound around the first reel 2462A to the first sprocket 243A. The operator then enters an instruction to rotate the first sprocket 243A, thereby causing the first sprocket 243A to send off the component storage tape 245, and then fits the front end of the component storage tape 245 to the second sprocket 243B.

At a point at which the above preparation work is over, the first tape feeder 241 starts its component feeding operation. In the first tape feeder 241, the second sprocket 243B rotates, thus sending off the component storage tape 245. At this time, the first sprocket 243A is left idling. The component storage tape 245 is therefore sent off by the rotating second sprocket 243B only.

Subsequently, as the first reel 2462A is sending out the component storage tape 245, the operator carries out work of disengaging the component storage tape 245 from the first sprocket 243A. At this point of time, the component storage tape 245 is already fitted to the second sprocket 243B. When disengaged from the first sprocket 243A, therefore, the component storage tape 245 is kept sent off by the rotating second sprocket 243B.

Subsequently, as the first reel 2462A is sending out the component storage tape 245, the operator removes the first reel 2462A from the first reel holder 2461A at the lower stage to attach the first reel 2462A to the second reel holder 2461B at an upper stage. Subsequently, as the first reel 2462A, which is held by the second reel holder 2461B at the upper stage, is sending out the component storage tape 245, the operator attaches the second reel 2462B wound with another component storage tape 245 to the first reel holder 2461A at the lower stage, and fits a front end of the component storage tape 245 wound around the second reel 2462B to the first sprocket 243A. In this manner, before the component storage tape 245 wound around the first reel 2462A runs out, the second reel 2462B can be attached to the first reel holder 2461A.

Subsequently, at a point of time at which the first reel 2462A, which is held by the second reel holder 2461B at the upper stage, has sent out the component storage tape 245 completely, the second reel 2462B, which is held by the first reel holder 2461A at the lower stage, automatically starts sending off the component storage tape 245. In this manner, transition from the preceding component storage tape 245 to the following component storage tape 245 is performed automatically.

[Component Feeding Operation of Second Tape Feeder 241A]

The second tape feeder 241A (non-ALF) adopting the second supply method, i.e., splicing tape supply method carries out a component feeding operation in the following manner. The operator first fits one reel to the second tape feeder 241A. The component storage tape 245 wound around the reel fitted to the second tape feeder 241A is sent off by a tape send-off mechanism. As a result, the components E stored in the component storage tape 245 are fed. At a point of time at which the component storage tape 245 is sent off completely from the one reel fitted to the tape feeder 214A, to perform transition from the component storage tape 245, i.e., a preceding component storage tape 245, to a component storage tape 245 for replenishment, the operator carries out splicing work of splicing a rear end of the preceding component storage tape 245 to a front end of the component storage tape 245 for replenishment by pasting a splicing tape or the like on a part where both ends join. At the second tape feeder 241A, transition from the preceding component storage tape 245 to the following component storage tape 245 for replenishment is performed by the operator, as the above splicing work.

<Component Supply Work Carried Out at Tape Feeder>

[Component Supply Work Carried Out at First Tape Feeder]

In the case of the first tape feeder 241, as described above, at a point of time at which the first reel 2462A, which is held by the second reel holder 2461B at the upper stage, has sent out the component storage tape 245 completely, the second reel 2462B, which is held by the first reel holder 2461A at the lower stage, automatically starts sending off the component storage tape 245. In this state, the operator removes the first reel 2462A, which runs out of a tape to send off, from the second reel holder 2461B at the upper stage, and then moves the second reel 2462B from the first reel holder 2461A at the lower stage to attach the second reel 2462B to the second reel holder 2461B at the upper stage. Hence, a new reel wound with a component storage tape 245 can be supplied to the first reel holder 2461A at the lower stage.

At this time, the operator carries out reading work of reading the second recording portion 2462C attached to the new reel for replenishment, using the reading device. The operator carries out also reading work of reading the first recording portion 248 attached to the first tape feeder 241 supplied with the new reel, using the reading device. Information read by the reading device, i.e., feeder information recorded on the first recording portion 248 and readable component information recorded on the second recording portion 2462C are input to the feeder management device 3 via a data communication unit 31, which will be described later. Upon receiving the feeder information and readable component information, the feeder management device 3 checks these pieces of information and judges whether the operator is properly fitting the new reel for replenishment to the first tape feeder 241.

At the first tape feeder 241, a period between a point of time at which the first reel 2462A runs out of the component storage tape to send off and a point of time at which the second reel 2462B runs out of the component storage tape to send off is a supply time zone in which a new reel can be supplied. This means that the first tape feeder 241 allows choosing a proper point of time to supply a new reel within the supply time zone, thus giving a high degree of freedom in supplying a new reel. If respective supply time zones of a plurality of first tape feeders 241 overlap to create an overlapping supply time zone, new reels can be supplied to the first tape feeders 241, respectively, at the same point of time within the overlapping supply time zone. Specifically, "collective supply", which allows the operator to carry out component supply work collectively, can be performed at the first tape feeders 241 that can be supplied with reels, respectively, at the same point of time. As described above, the first tape feeder 241 does not require component supply work of a special form, such as splicing work, and allows "collective supply". It can be said, therefore, that the first tape feeder 241 is a tape feeder supplying the component storage tape easily and improving the efficiency of component supply work.

[Component Supply Work Carried Out at Second Tape Feeder]

According to the second tape feeder 241A, as described above, at the point of time at which the component storage tape 245 is sent off completely from the one reel fitted to the tape feeder 214A, the operator carries out splicing work of splicing the rear end of the preceding component storage tape 245 to the front end of the component storage tape 245 for replenishment, as component supply work. At this time, the operator carries out reading work of reading a recording portion attached to a reel wound with the component storage tape 245 for replenishment, using the reading device. The operator carries out also reading work of reading a recording portion attached to the second tape feeder 241A for which the splicing work is done, using the reading device. Information read by the reading device, i.e., feeder information recorded on the recording portion of the second tape feeder 241A and readable component information recorded on the recording portion of the reel are input to the feeder management device 3 via the data communication unit 31, which will be described later. Upon receiving the feeder information and readable component information, the feeder management device 3 checks these pieces of information and judges whether the operator is properly supplying the component storage tape 245 for replenishment to the second tape feeder 241A.

According to the second tape feeder 241A, the splicing work is carried out at the point of time at which the component storage tape 245 is sent off completely from the one reel. A point of time of supplying the reel wound with the component storage tape 245 for replenishment is, therefore, limited to the point of time at which the preceding component storage tape 245 is sent off completely.

<Configuration of Feeder Management Device>

Figure 7:
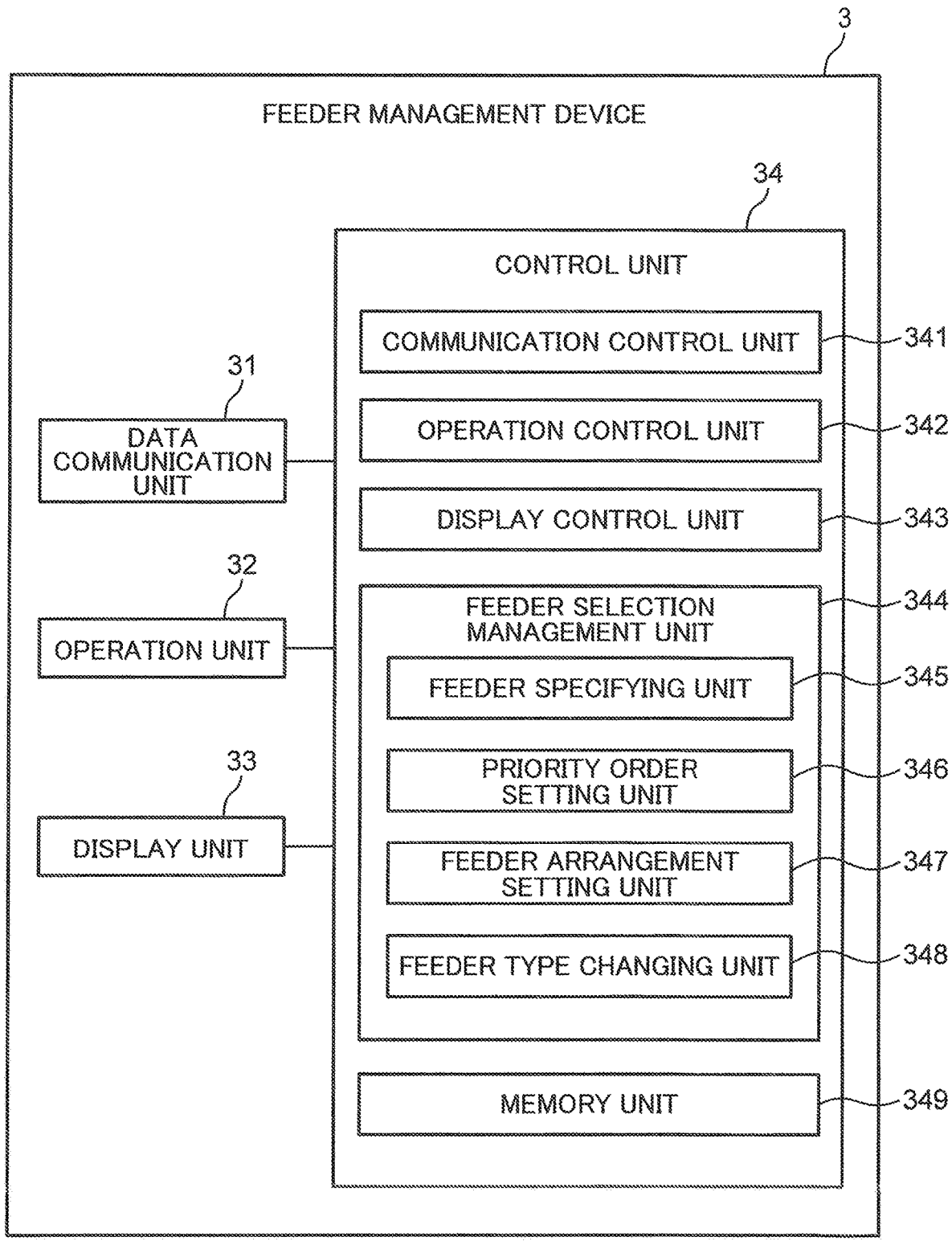
FIG. 7 is a block diagram of a configuration of the feeder management device.

The feeder management device 3 is a device that manages selection of a tape feeder to be set at each set position defined for each component in the component feeding units 24A, 24B, 24C, and 24D of the component-mounting device 2. In a state in which various first tape feeders 241 and second tape feeders 214A different in method of supplying the component storage tape 245 are present together, the feeder management device 3 enables selection of a tape feeder for each component, the tape feeder allowing the operator to smoothly carry out component supply work. A configuration of the feeder management device 3 will be described with reference to FIGS. 1 and 7. FIG. 7 is a block diagram of the configuration of the feeder management device 3.

As described above, the feeder management device 3 is connected to the mounting operation management device 4 and the production plan management device 5 in such a way as to be capable of data communication with the mounting operation management device 4 and the production plan management device 5, as shown in FIG. 1. The feeder management device 3 includes, for example, a microcomputer, and has a data communication unit 31, an operation unit 32, a display unit 33, and a control unit 34, as shown in FIG. 7.

In the feeder management device 3, the operation unit 32 has a touch panel, numerical keys, a start key, a setting key, and the like, and receives input of the operator's operation and various settings on the feeder management device 3.

The data communication unit 31 is an interface circuit through which data communication with the mounting operation management device 4 and the production plan management device 5 is carried out. The data communication unit 31 acquires incoming information from the operation management device 4 and the production plan management device 5 and gives the acquired information to the control unit 34. In addition, the data communication unit 31 transmits (outputs) information given by the control unit 34, to the operation management device 4 and to the production plan management device 5. Further, the data communication unit 31 acquires readable component information, which is read by the reading device from the recording portion attached to the reel wound with the component storage tape 245, and feeder information, which is read by the reading device from the recording portions attached respectively to the first tape feeder 241 and the second tape feeder 241A, and gives the acquired readable component information and feeder information to the control unit 34.

The mounting operation management device 4 and the production plan management device 5, which are connected to the feeder management device 3 in such a way as to be capable of data communication therewith, will be described.

The mounting operation management device 4 is a device that is disposed close to the component-mounting device 2 and that manages a component mounting operation (component packaging operation) carried out by the component-mounting device 2. The mounting operation management device 4 is provided as, for example, a microcomputer. The operator in charge of operating the component-mounting device 2 operates the mounting operation management device 4 to cause it to control the component mounting operation of the component-mounting devices 2.

The mounting operation management device 4 receives input of specifying result information, arrangement setting information, and type change information that are transmitted from the feeder management device 3 to the mounting operation management device 4 via the data communication unit 31. The specifying result information is information indicating a result of specifying a tape feeder for each component, the information being created by a feeder specifying unit 345, which will be described later. The arrangement setting information is information indicating a result of setting of tape feeder arrangement in the component feeding units 24A, 24B, 24C, and 24D of the component-mounting device 2, the information being created by a feeder arrangement setting unit 347, which will be described later. The type change information is information indicating a result of change of tape feeder arrangement, the information being created by a feeder type changing unit 348, which will be described later. In carrying out tape feeder pre-arrangement work, the operator who operates the component-mounting device 2 arranges tape feeders in the component feeding units 24A, 24B, 24C, and 24D of the component-mounting device 2 such that the tape feeders are put in tape feeder arrangement indicated by the arrangement setting information or the type change information. Referring to the specifying result information, the operator also carries out component supply work of supplying the component storage tape 245 to the taper feeder.

The production plan management device 5 is a device that manages a production plan for producing component-mounting boards by the component-mounting devices 2. The production plan management device 5 is provided as, for example, a microcomputer. Being operated by an operator who sets up a production plan, the production plan management device 5 transmits production plan information on the production plan for producing the component-mounting boards, to the feeder management device 3. The production plan information includes package component information including identification information for identifying components used for production of the component-mounting boards and component type information on component types, number-of-components information on the number of components to be mounted on the component-mounting board, production order information on the order of production of the component-mounting boards, and production volume information on the volume of component-mounting boards produced per unit period (e.g., one day). The production plan information transmitted by the production plan management device 5 is input to the feeder management device 3 via the data communication unit 31. The feeder management device 3 refers to the production plan information, which is input to the feeder management device 3 via the communication unit 31, and manages selection of a tape feeder to be set at each set position defined for each component in the component feeding units 24A, 24B, 24C, and 24D.

In the feeder management device 3, the control unit 34 is composed of a central processing unit (CPU), a read-only memory (ROM) that stores a control program, a random access memory (RAM) used as a work area for the CPU, and the like. As a result of the CPU's executing the control program stored in the ROM, the control unit 34 controls the data communication unit 31, the operation unit 32, and the display unit 33, and creates and outputs various pieces of information on a tape feeder to be set at each set position in the component feeding units 24A, 24B, 24C, and 24D. As shown in FIG. 7, the control unit 34 includes a communication control unit 341, an operation control unit 342, a display control unit 343, a feeder selection management unit 344, and a memory unit 349.

The communication control unit 341 controls data communication with the mounting operation management device 4 and the production plan management device 5, the data communication being carried out through the data communication unit 31. The operation control unit 342 controls the operation unit 32. The display control unit 343 controls information display performed by the display unit 33.

The memory unit 349 stores list information indicating, for each component, whether or not to use a tape feeder of a special type among a plurality of tape feeders different in method of supplying the component storage tape 245, the tape feeder of the special type making supply of the component storage tape 245 easier. According to this embodiment, the plurality of tape feeders include tape feeders 241 (ALF) that adopt the first supply method, i.e., autoloading tape supply method and tape feeders 241A (non-ALF) that adopt the second supply method, i.e., splicing tape supply method. The first tape feeder 241 adopting the first supply method is a tape feeder of a special type that makes supply of the component storage tape 245 easier.

FIG. 8 is a diagram for describing list information JA1 stored in the memory unit 349. The list information JA1 stored in the memory unit 349 includes component type information (component name) JA11, special type feeder use permission/non-permission information (ALF use permission/non-permission) JA12, recommended size information (recommended size) JA13, usable size information (usable size) JA14, and specified size information (specified size) JA15 that are associated with each other. The component type information JA11 is information on the type of components stored in the component storage tape 245. The special type feeder use permission/non-permission information JA12 is information indicating whether the use of the first tape feeder 241 adopting the first supply method, which is a tape feeder of a special type, is permitted or not. The recommended size information JA13 is information on the size of a tape guide 244 recommended to be used in the first tape feeder 241 adopting the first supply method. The usable size information JA14 is information on the size of a tape guide 244 that can be used in the first tape feeder 241 adopting the first supply method. The specified size information JA15 is information indicating the size of a tape guide 244 in the first tape feeder 241, the size being specified by the operator for each component. This specified size information JA15 can be rewritten by the operator. When a size of a tape guide 244 is specified by the operator's making a size entry in a specified size information JA15 column in the list information JA1 the highest priority is given to use of a first tape feeder 241 having the tape guide 244 of the specified size. When a size of a tape guide 244 is not specified by the operator's making a size entry in the specified size information JA15 column in the list information JA1, on the other hand, priority is given to use of a first tape feeder 241 having a tape guide 244 of a size indicated by the recommended size information JA13. When a size of a tape guide 244 is specified by the operator's making a size entry in the specified size information JA15 column, the usable size information JA14 is used to check whether the tape guide 244 of the specified size is a proper tape guide.

The list information JA1 shown in FIG. 8 demonstrates that, for a special component of which component type information JA11 is "SP1", use of the first tape feeder 241 (ALF) adopting the first supply method is permitted, as indicated by "use is permitted" entered in a special type feeder use permission/non-permission information JA12 column. The first tape feeder 241 of which "use is permitted" for the special component of the component type "SP1" is usable when the first tape feeder 241 has a tape guide 244 of a size "S" indicated in a usable size information JA14 column. Thus, the first tape feeder 241 having the tape guide 244 of the size "S", which is indicated in a recommended size information JA13, is recommended.

The list information JA1 shown in FIG. 8 demonstrates also that, for a special component of which component type information JA11 is "SP2", use of the first tape feeder 241 (ALF) adopting the first supply method is permitted, as indicated by "use is permitted" entered in the special type feeder use permission/non-permission information JA12 column. The first tape feeder 241 of which "use is permitted" for the special component of the component type "SP2" is usable when the first tape feeder 241 has a tape guide 244 of a size "S/M" indicated in the usable size information JA14 column. Thus, the first tape feeder 241 having a tape guide 244 of the size "S", which is indicated in the recommended size information JA13, is recommended. The tape guide 244 of the size "S/M" means a tape guide of the size "S" and a tape guide of a size "M", which are both tape guides of a usable size.

The list information JA1 demonstrates also that, for a special component of which component type information JA11 is "SP3", use of the first tape feeder 241 (ALF) adopting the first supply method is permitted, as indicated by "use is permitted" entered in the special type feeder use permission/non-permission information JA12 column. The first tape feeder 241 of which "use is permitted" for the special component of the component type "SP3" is usable when the first tape feeder 241 has a tape guide 244 of the size "S/M" indicated in the usable size information JA14 column. Thus, the first tape feeder 241 having a tape guide 244 of the size "S", which is indicated in the recommended size information JA13, is recommended. In this case, the size of the tape guide 244 is specified as "S", as indicated in a specified size information JA15 column.

The list information JA1 demonstrates also that, for a special component of which component type information JA11 is "SP4", use of the first tape feeder 241 (ALF) adopting the first supply method is permitted, as indicated by "use is permitted" entered in the special type feeder use permission/non-permission information JA12 column. The first tape feeder 241 of which "use is permitted" for the special component of the component type "SP4" is usable when the first tape feeder 241 has a tape guide 244 of a size "M/L" indicated in the usable size information JA14 column. Thus, the first tape feeder 241 having a tape guide 244 of the size "M", which is indicated in the recommended size information JA13, is recommended. The tape guide 244 of the size "M/L" means a tape guide of the size "M" and a tape guide of a size "L", which are both tape guides with a usable size. In this case, the size of the tape guide 244 is specified as "L", as indicated in the specified size information JA15 column.

The list information JA1 demonstrates also that, for a special component of which component type information JA11 is "SP5", the first tape feeder 241 (ALF) adopting the first supply method is permitted, as indicated by "use is permitted" entered in the special type feeder use permission/non-permission information JA12 column. The first tape feeder 241 of which "use is permitted" for the special component of the component type "SP5" is usable when the first tape feeder 241 has a tape guide 244 of a size "M/L/LL" indicated in the usable size information JA14 column. Thus, the first tape feeder 241 having a tape guide 244 of the size "L", which is indicated in the recommended size information JA13, is recommended. The tape guide 244 of the size "M/L/LL" means a tape guide of the size "M", a tape guide of the size "L", and a tape guide of a size "LL" which are all tape guides of a usable size. In this case, the size of the tape guide 244 is specified as "L/LL", as indicated in the specified size information JA15 column.

The list information JA1 demonstrates also that, for a component of which component type information JA11 is "A1", use of the first tape feeder 241 (ALF) adopting the first supply method is not permitted, as indicated by "use is not permitted" entered in the special type feeder use permission/non-permission information JA12 column. The list information JA1 demonstrates also that, for a component of which component type information JA11 is "A2", use of the first tape feeder 241 (ALF) adopting the first supply method is not permitted, as indicated by "use is not permitted" entered in the special type feeder use permission/non-permission information JA12 column.

In the list information JA1, information indicating whether or not to use the first tape feeder 241 for each component is entered by the operator or automatically entered by the feeder management device 3. In the case of automatic entry by the feeder management device 3, the feeder management device 3 checks component size information of each component indicated by the component type information JA11 against the recommended size information JA13, the usable size information JA14, and the specified size information JA15, which are information on the size of the tape guide 244 used in the first tape feeder 241, and determines whether or not to use the first tape feeder 241 for each component.

The feeder selection management unit 344 of the control unit 34 refers to the list information JA1 stored in the memory unit 349, and manages selection of a tape feeder for each component, the selection corresponding to each set position in the component feeding units 24A, 24B, 24C, and 24D of the component-mounting device 2. As described above, the list information JA1, which the feeder selection management unit 344 refers to, is information indicating, for each component, whether or not to use the first tape feeder 241, i.e., the tape feeder of the special type that makes supply of the component storage tape 245 easier. Thus, in managing tape feeder selection, the feeder selection management unit 344 determines which of the first tape feeder 241 and the second tape feeder 241A is to be selected while taking account of the efficiency of component supply work for each component. As a result, in a state in which first tape feeders 241 and second tape feeders 241A different in method of supplying the component storage tape 245 are present together, a tape feeder that allows the operator to smoothly carry out component supply work can be selected. A case where a delay in component supply work causes component feeding from the tape feeder 241 or 241A to stop and the efficiency of production of the component-mounting board drops as a consequence, therefore, can be prevented as much as possible.

As shown in FIG. 7, according to this embodiment, the feeder selection management unit 344 includes the feeder specifying unit 345, a priority order setting unit 346, the feeder arrangement setting unit 347, and the feeder type changing unit 348.

Referring to the list information JA1, the feeder selection management unit 344 compares the number of first tape feeders 241 (ALF) adopting the first supply method that are present among a plurality of tape feeders 241 and 241A different in method of supplying the component storage tape 245 with the number of special components for which use of the first tape feeder 241 is permitted in the list information JA1. When the number of the first tape feeders 241 is equal to or more than the number of the special components, the feeder selection management unit 344 outputs first judgement information. When the number of the first tape feeders 241 is smaller than the number of the special components, the feeder selection management unit 344 outputs second judgement information. When the feeder selection management unit 344 outputs the first judgement information, a limit on use of the first tape feeder 241 that arises because of the number of the first tape feeders 241 does not exist.

When the feeder selection management unit 344 outputs the second judgement information, in contrast, the limit on use of the first tape feeder 241 that arises because of the number of the first tape feeders 241 exists.

The feeder specifying unit 345 of the feeder selection management unit 344 specifies, for each component, a tape feeder among the plurality of tape feeders 241 and 241A different in method of supplying the component storage tape 245, the tape feeder being suitable for component feeding corresponding to each set position in the component feeding units 24A, 24B, 24C, and 24D of the component-mounting device 2, based on the list information JA1. When the first judgement information is output by the feeder selection management unit 344, that is, when the limit on use of the first tape feeder 241 (ALF) that arises because of the number of the first tape feeders 241 (ALF) does not exist, the feeder specifying unit 345 specifies the first tape feeder 241 as a tape feeder suitable for feeding a special component for which use of the first tape feeder 241 is permitted in the list information JA1. When a size of the tape guide 244 is specified in the specified size information JA15 column of the list information JA1, the feeder specifying unit 345 specifies in priority a first tape feeder 241 having a tape guide 244 of the specified size. When no size of the tape guide 244 is specified in the specified size information JA15 column of the list information JA1, on the other hand, the feeder specifying unit 345, basically, specifies a first tape feeder 241 having a tape guide 244 of a size indicated in the recommended size information JA13 column. When the number of first tape feeders 241 each having the tape guide 244 of the size indicated in the recommended size information JA13 is limited to be smaller than the number of first tape feeders 241 to be specified, the feeder specifying unit 345 may specify a first tape feeder 241 having a tape guide 244 of a size indicated in the usable size information JA14. In addition, the feeder specifying unit 345 specifies the second tape feeder 241A (non-ALF) as a tape feeder suitable for feeding a component for which use of the first tape feeder 241 is not permitted in the list information JA1.

By referring to the list information JA1 stored in the memory unit 349, the feeder specifying unit 345 can specify, for each component, a tape feeder suitable for component feeding corresponding to each set position in the component feeding units 24A, 24B, 24C, and 24D while taking account of the efficiency of component supply work. When the feeder selection management unit 344 outputs the first judgement information, the feeder specifying unit 345 creates first specifying result information indicating a result of specifying a tape feeder for each component. An example of first specifying result information created by the feeder specifying unit 345 is shown in FIG. 9.

Figure 9:
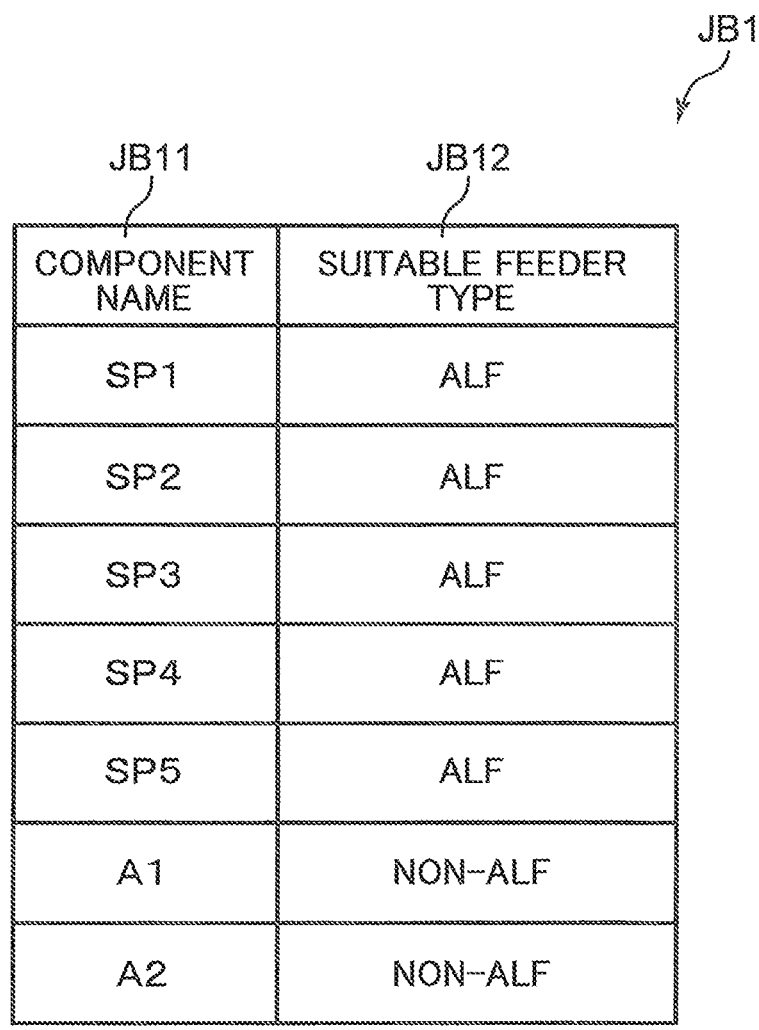
FIG. 9 is a diagram for describing first specifying result information created by a feeder specifying unit of the feeder management device.

FIG. 9 is a diagram for describing first specifying result information JB1 created by the feeder specifying unit 345. The first specifying result information JB1 shown in FIG. 9 includes component type information (component name) JB11 and suitable feeder type information (suitable feeder type) JB12 that are associated with each other. The component type information JB11 is information on the type of components stored in the component storage tape 245. The suitable feeder type information JB12 is information indicating the type of a tape feeder suitable for component feeding corresponding to each set position in the component feeding units 24A, 24B, 24C, and 24D.

The first specifying result information JB1 shown in FIG. 9 demonstrates that, for feeding special components whose types are indicated as "SP1", "SP2", "SP3", "SP4" and "SP5" in a component type information JB11 column, the first feeder 241 whose type is indicated as "ALF" in a suitable feeder type information JB12 column is a suitable tape feeder to be used. The first specifying result information JB1 demonstrates also that, for feeding components whose types are indicated as "A1" and "A2" in the component type information JB11 column, the second feeder 241A whose type is indicated as "non-ALF" in the applicable feeder type information JB12 column is a suitable tape feeder to be used.

According to this embodiment, the display unit 33 of the feeder management device 3 may be configured to display the first specifying result information JB1 created by the feeder specifying unit 345. By referring to the first specifying result information JB1 displayed by the display unit 33, the operator is able to carry out component supply work of supplying the component storage tape 245 to the tape feeder 241 or 241A set at each set position in the component feeding units 24A, 24B, 24C, and 24D, the component storage tape 245 carrying components corresponding to the set position.

The priority order setting unit 346 of the feeder selection management unit 344 will then be described. When the second judgement information is output by the feeder selection management unit 344, that is, when the limit on use of the first tape feeder 241 (ALF) that arises because of the number of the first tape feeders 241 (ALF) exists, it is necessary to determine, in feeding special components, for which special component the first tape feeder 241 is to be used in priority. To meet this requirement, the priority order setting unit 346 sets a priority order of use of the first tape feeder 241 in such a way as to associate the priority order with a special component for which use of the first tape feeder 241 is permitted in the list information JA1.

The priority order setting unit 346 calculates the number of times of supply of the component storage tape 245 for replenishment, which carries special components, to the first tape feeder 241, the number of times of supply varying depending on the volume of production of component-mounting boards, and sets the priority order of use of the first tape feeder 241, in an order of the larger number of times of supply. More specifically, the priority order setting unit 346 calculates the number of times of supply, based on number-of-mounted components information and number-of-components information on the number of special components per reel, and sets the priority order of use of the first tape feeder 241, in the order of the larger number of times of supply.

The number-of-mounted components information is information on the number of special components mounted on the component-mounting board, indicating the number of special components mounted on one component-mounting board or the number of special components mounted on component-mounting boards produced in a unit period. The number-of-mounted components information is included in the production plan information transmitted from the production plan management device 5 to the feeder management device 3 via the data communication unit 31. The number-of-components information on the number of special components per reel is information indicating the number of special components stored in the component storage tape 245 wound around a reel. This information is included in the readable component information recorded on the second recording portion 2462C attached to the reel. The readable component information is read by the reading device when it scans the second recording portion 2462C, and is input to the feeder management device 3 via the data communication unit 31.

The priority order setting unit 346 divides the number of special components mounted on the component-mounting board, which is indicated by the number-of-mounted components information, by the number of special components per reel, which is indicated by the number-of-components information, thereby calculating the number of times of supply. When the above division produces zero reminder (when the division is operated without a reminder), the priority order setting unit 346 determines a value given by subtracting "1" from the quotient to be the number of times of supply. When the division produces a reminder that is not zero (when the division is operated with a reminder), the priority order setting unit 346 determines the quotient to be the number of times of supply. The priority order setting unit 346 sets the priority order of use of the first tape feeder 241, in the order of the larger number of times of supply that is calculated in the above manner.

Figure 10:
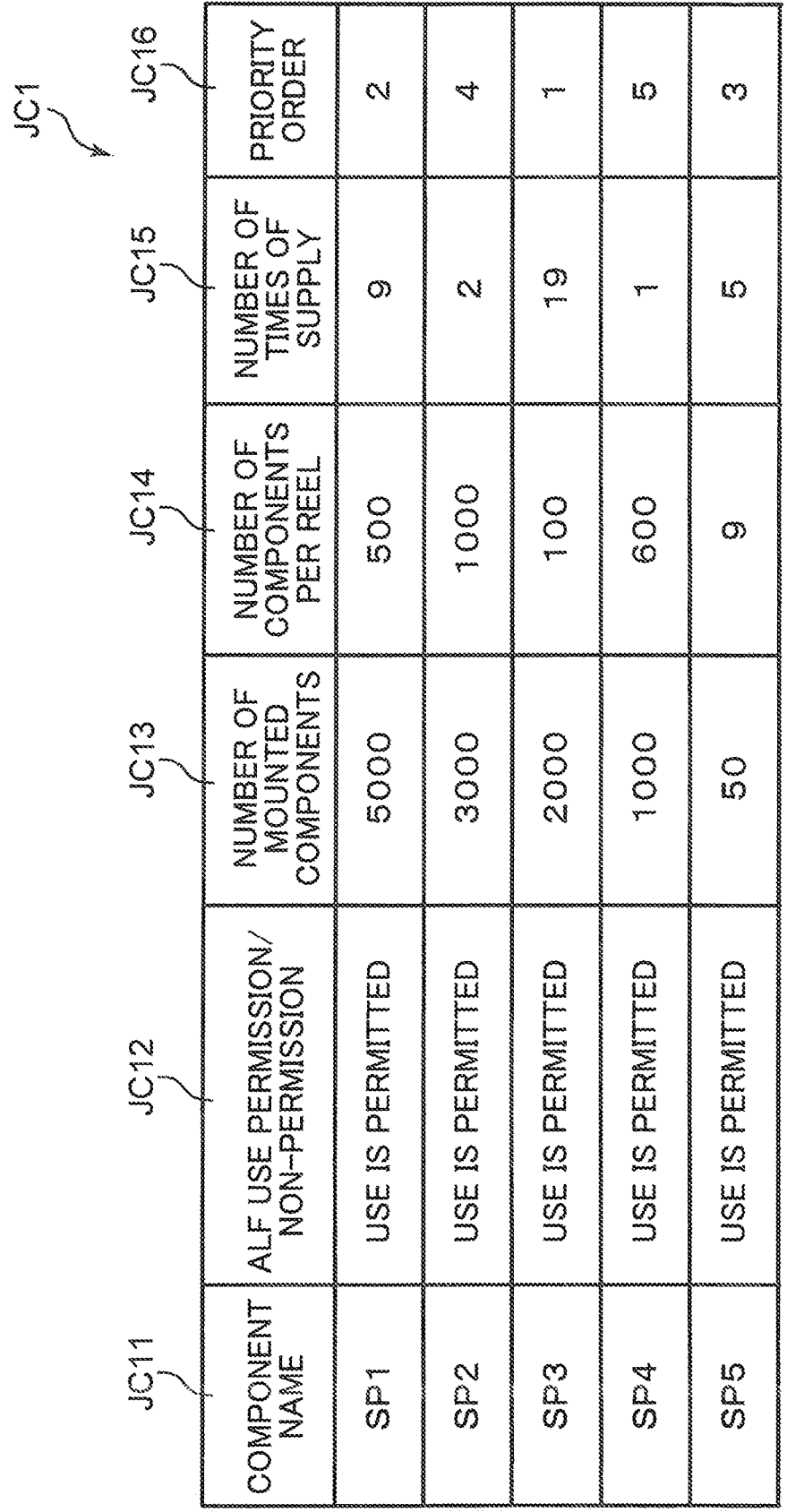
FIG. 10 is a diagram for describing priority order setting information created by a priority order setting unit of the feeder management device.

The priority order setting unit 346 creates priority order setting information indicating a result of setting of the priority order of use of the first tape feeder 241. The priority order setting information created by the priority order setting unit 346 will be described with reference to FIG. 10. FIG. 10 is a diagram for describing priority order setting information JC1 created by the priority order setting unit 346. The example of FIG. 10 shows the priority order of use of the first tape feeder 241 for each of five special components for which use of the first tape feeder 241 (ALF) is permitted in the list information JA1. FIG. 10 shows also number-of-mounted components information (number-of-mounted components) JC13 and number-of-components information (number of components per reel) JC14, which are used when the priority order setting unit 346 calculates the number of times of supply JC15.

The priority order setting information JC1 created by the priority order setting unit 346 includes special component type information (component name) JC11, special type feeder use permission/non-permission information (ALF use permission/non-permission) JC12, and priority order information (priority order) JC16 that are associated with each other. The special component type information JC11 is information indicating the type of a special component for which use of the first tape feeder 241 (ALF) is permitted in the list information JA1. The special type feeder use permission/non-permission information JC12 is information indicating whether or not to use the first tape feeder 241 (ALF). The priority order information JC16 is information indicating the priority order of use of the first tape feeder 241 for each special component.

In the example of FIG. 10, the number of times of supply JC15 is calculated by the priority order setting unit 346, for each of special components of which the component names are indicated respectively as "SP1", "SP2", "SP3", "SP4", and "SP5" in a special component type information JC11 column and for which use of the first tape feeder 241 (ALF) is permitted, as "use is permitted" indicated in a special type feeder use permission/non-permission information JC12 column.

For the special component of which the component name is indicated as "SP1" in the special component type information JC11 column, the priority order setting unit 346 divides "5000" representing the number of special components mounted on the package board and being indicated in a number-of-mounted components information JC13 column, by "500" representing the number of special component per reel and being indicated in a number-of-components information column JC14, thereby calculating the number of times of supply JC15 at "9". For the special component of which the component name is indicated as "SP2" in the special component type information JC11 column, the priority order setting unit 346 divides "3000" representing the number of special components mounted on the package board and being indicated in the number-of-mounted components information JC13 column, by "1000" representing the number of special component per reel and being indicated in the number-of-components information column JC14, thereby calculating the number of times of supply JC15 at "2". For the special component of which the component name is indicated as "SP3" in the special component type information JC11 column, the priority order setting unit 346 divides "2000" representing the number of special components mounted on the package board and being indicated in the number-of-mounted components information JC13 column, by "100" representing the number of special component per reel and being indicated in the number-of-components information column JC14, thereby calculating the number of times of supply JC15 at "19". For the special component of which the component name is indicated as "SP4" in the special component type information JC11 column, the priority order setting unit 346 divides "1000" representing the number of special components mounted on the package board and being indicated in the number-of-mounted components information JC13 column, by "600" representing the number of special component per reel and being indicated in the number-of-components information column JC14, thereby calculating the number of times of supply JC15 at "1". For the special component of which the component name is indicated as "SP5" in the special component type information JC11 column, the priority order setting unit 346 divides "50" representing the number of special components mounted on the package board and being indicated in the number-of-mounted components information JC13 column, by "9" representing the number of special components per reel and being indicated in the number-of-components information column JC14, thereby calculating the number of times of supply JC15 at "5".

The numbers of times of supply JC15 calculated respectively by the priority order setting unit 346 are greater in the order of "SP3", "SP1", "SP5", "SP2" and "SP4", which are respective component types of special components indicated in the special component type information JC11 column. Based on such a result of calculation of the number of times of supply JC15, the priority order setting unit 346 sets a priority order "1" indicated in the priority order information JC16 column, for the special component "SP3" to which the largest number of times of supply JC15 corresponds. In the same manner, the priority order setting unit 346 sets a priority order "2" for the special component "SP1" to which the second largest number of times of supply JC15 corresponds, sets a priority order "3" for the special component "SP5" to which the third largest number of times of supply JC15 corresponds, sets a priority order "4" for the special component "SP2" to which the fourth largest number of times of supply JC15 corresponds, and sets a priority order "5" for the special component "SP4" to which the fifth largest number of times of supply JC15 corresponds.

In the above manner, when the second judgement information is output by the feeder selection management unit 344 and the priority order of use of the first tape feeder 241 is set by the priority order setting unit 346, the feeder specifying unit 345 allocates the first tape feeder 241 to the special components, according to the set priority order. In other words, the feeder specifying unit 345 allocates the first tape feeder 241 to the special components, based on the priority order setting information JC1 created by the priority order setting unit 346. More specifically, the feeder specifying unit 345 allocates the first tape feeder 241 to the special components in order in such a way as to allocate the first tape feeder 241 first to the special component with the highest priority order, within a range of the limit on use of the first tape feeder 241 that arises because of the number of the first tape feeders 241. To a special component for which the priority order is so low that the first tape feeder 241 cannot be allocated to the special component, the feeder specifying unit 345 allocates the second tape feeder 241A.

As described above, even when the second judgement information is output by the feeder selection management unit 344 and the limit on use of the first tape feeder 241 that arises because of the number of the first tape feeders 241 exists, the feeder specifying unit 345 can specify, for each component, a tape feeder suitable for component feeding corresponding to each set position in the component feeding unit 24A, 24B, 24C, and 24D.

The priority order set by the priority order setting unit 346 is the priority order corresponding to the order of the larger number of times of supply of the component storage tape 245 to the first tape feeder 241. Now, the first tape feeder 241 is the tape feeder adopting the first supply method, i.e., autoloading tape supply method, which is the tape feeder of the special type that makes supply of the component storage tape 245 easier than supply of the component storage tape 245 at the second tape feeder 241A adopting the second supply method. For this reason, even if the component storage tape 245 is supplied frequently and, consequently, the frequency of component supply work increases, the operator is able to carry out component supply work without difficulty at the first tape feeder 241 adopting the first supply method. Allocating the first tape feeder 241 to the special components in the order of the larger number of times of supply of the component storage tape 245, therefore, means tape feeder selection by which the operator is allowed to smoothly carry out component supply work.

The first tape feeder 241 adopting the first supply method is the tape feeder that can be fitted with a plurality of component storage tapes 245, i.e., a preceding component storage tape 245 and a following component storage tape 245 for replenishment. In the case of the first tape feeder 241 adopting the first supply method configured in such a manner, a time zone between a point of time at which the preceding component storage tape 245 runs out of components to feed and a point of time at which the following component storage tape 245 runs out of components to feed is a supply time zone in which a new component storage tape 245 can be supplied. This means that the first tape feeder 241 adopting the first supply method allows choosing a proper point of time to supply a new component storage tape 245 within the supply time zone, thus giving a high degree of freedom in supplying a new component storage tape 245. If respective supply time zones of a plurality of first tape feeders 241 adopting the first supply method overlap to create an overlapping supply time zone, new component storage tapes 245 can be supplied to the first tape feeders 241 adopting the first supply method, respectively, at the same point of time. Specifically, "collective supply", which allows the operator to carry out component supply work collectively, can be performed at tape feeders that can be supplied with component storage tapes 245, respectively, at the same point of time. The priority order setting unit 346 sets the priority order of use of the first tape feeder 241 adopting the first supply method that allows "collective supply", in the order of the larger number of times of supply of the component storage tape 245. Thus, even when the component storage tape 245 is supplied frequently, the frequency of the operator's coming to the component-mounting device 2 can be reduced by performing "collective supply", so that the operator's burden resulting from component supply work can be reduced.

Figure 11:
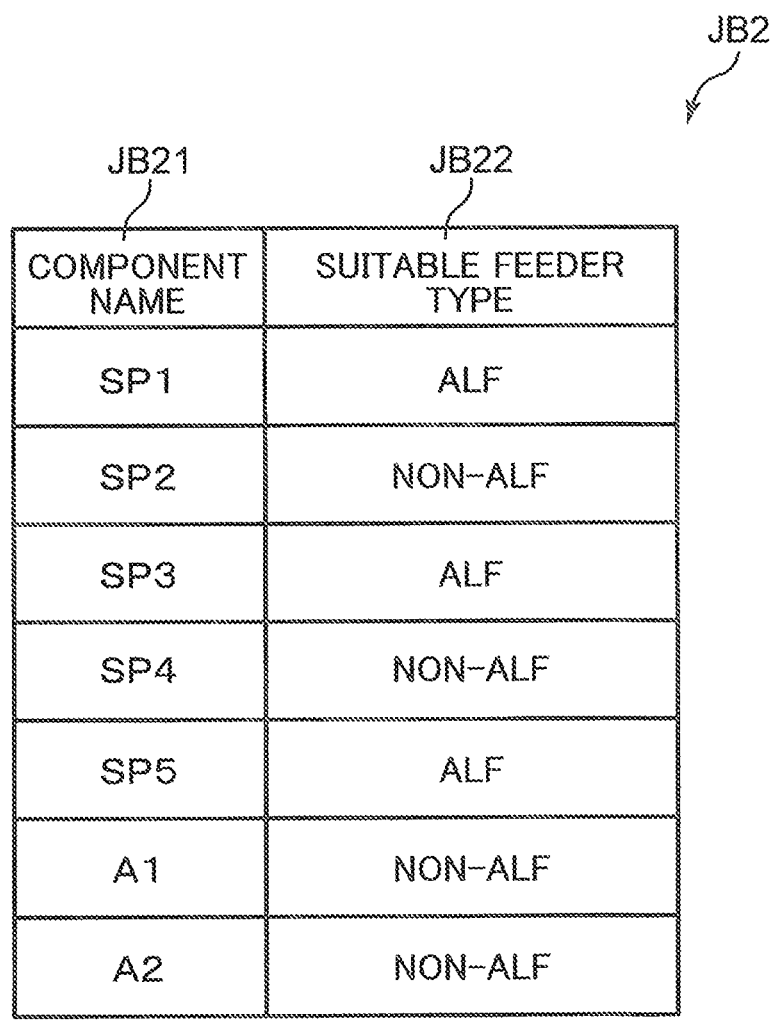
FIG. 11 is a diagram for describing second specifying result information that is created by the feeder specifying unit, based on the priority order setting information.

The feeder specifying unit 345 creates second specifying result information indicating a result of specifying a tape feeder for each component, the second specifying result information being based on the priority order setting information created by the priority order setting unit 346. Second specifying result information created by the feeder specifying unit 345 is shown in FIG. 11. FIG. 11 is a diagram for describing second specifying result information JB2 created by the feeder specifying unit 345. The second specifying result information JB2 shown in FIG. 11 is created by the feeder specifying unit 345, which refers to the priority order setting information JC1 shown in FIG. 10 when creating the second specifying result information JB2.

The second specifying result information JB2 shown in FIG. 11 includes component type information (component name) JB21 and suitable feeder type information (suitable feeder type) JB22 that are associated with each other. The component type information JB21 is information on the type of components stored in the component storage tape 245. The suitable feeder type information JB22 is information indicating the type of a tape feeder suitable for component feeding corresponding to each set position in the component feeding units 24A, 24B, 24C, and 24D.

The second specifying result information JB2 shown in FIG. 11 is created by the feeder specifying unit 345 in a case where while the number of special components for which use of the first tape feeder 241 is permitted in the list information JA1 is "5", the number of first tape feeders 241 is "3". To the special components "SP3", "SP1", and "SP5", to which high priority orders 1, 2, and 3 correspond respectively, out of the special components "SP1", "SP2", "SP3", "SP4", and "SP5" indicated in a component type information JB21 column, the feeder specifying unit 345 allocates the first tape feeder 241, i.e., "ALF", as indicated in an applicable feeder type information JB22 column. To the special components "SP2" and "SP4", to which low priority orders 4 and 5 correspond respectively, the feeder specifying unit 345 allocates the second tape feeder 241A, i.e., "non-ALF", as indicated in the applicable feeder type information JB22 column. To the special components "A1" and "A2", for which use of the first tape feeder 241 is not permitted in the list information JA1 the feeder specifying unit 345 allocates the second tape feeder 241A, i.e., "non-ALF", as indicated in the applicable feeder type information JB22 column.

According to this embodiment, the display unit 33 of the feeder management device 3 may be configured to display the second specifying result information JB2 created by the feeder specifying unit 345. By referring to the second specifying result information JB2 displayed by the display unit 33, the operator is able to carry out component supply work of supplying the component storage tape 245 to the tape feeder 241 or 241A set at each set position in the component feeding units 24A, 24B, 24C, and 24D, the component storage tape 245 carrying components corresponding to the set position.

The feeder arrangement setting unit 347 of the feeder selection management unit 344 sets arrangement of tape feeders each set at each set position defined for each component in the component feeding units 24A, 24B, 24C, and 24D. The feeder arrangement setting unit 347 refers to the specifying result information (first specifying result information JB1 or second specifying result information JB2) indicating the result of specifying a tape feeder for each component, the specifying result information being created by the feeder specifying unit 345, and sets arrangement of tape feeders. Thus, arrangement of the tape feeders each set at each set position in the component feeding units 24A, 24B, 24C, and 24D corresponds to the result of specifying a tape feeder for each component, the result of specifying a tape feeder being given by the feeder specifying unit 345. This provides tape feeder arrangement that allows the operator to smoothly carry out component supply work.

Figure 12:
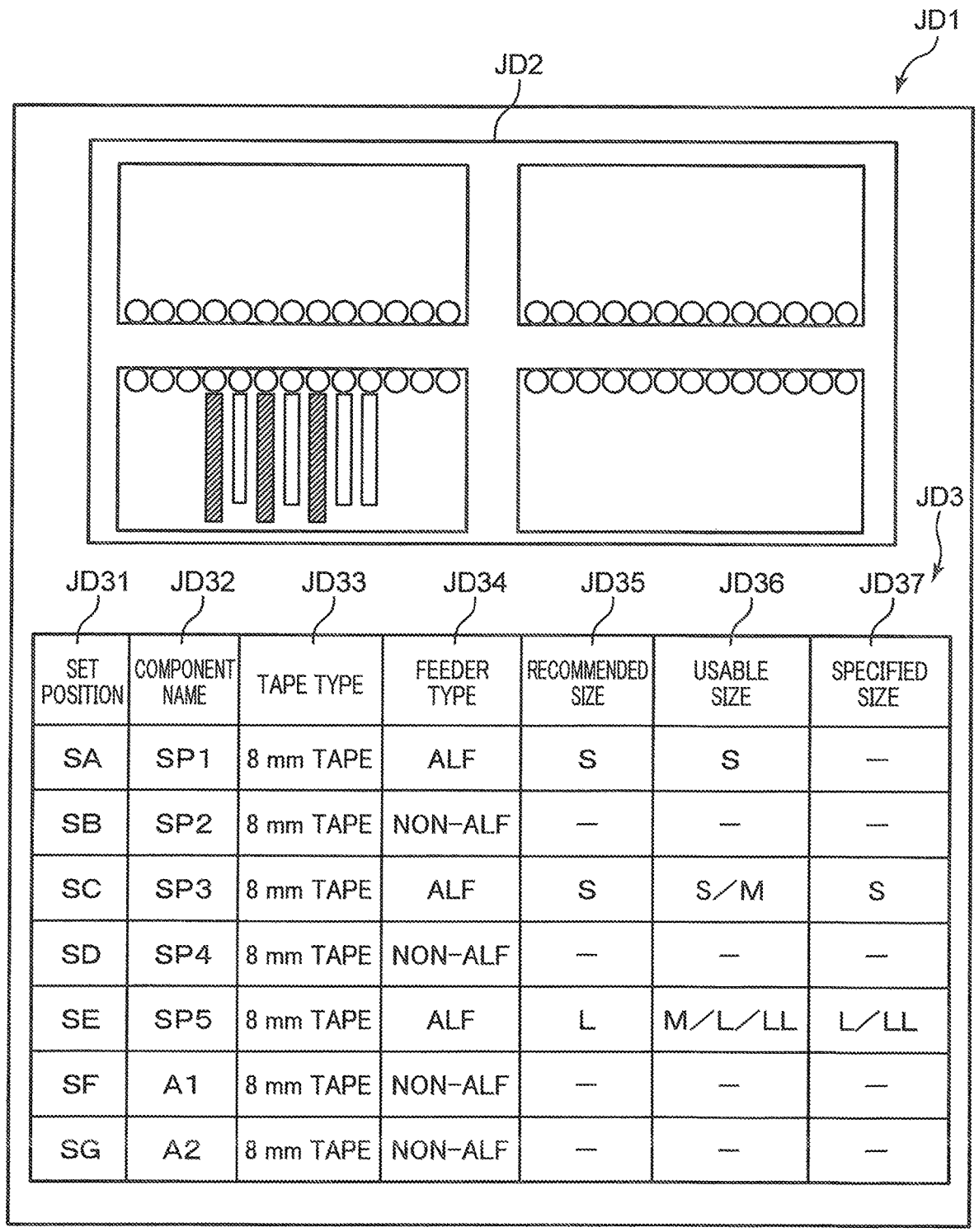
FIG. 12 is a diagram for describing arrangement setting information created by a feeder arrangement setting unit of the feeder management device.

According to this embodiment, the feeder arrangement setting unit 347 creates arrangement setting information indicating a result of setting of tape feeder arrangement. Arrangement setting information created by the feeder arrangement setting unit 347 is shown in FIG. 12. FIG. 12 is a diagram for describing arrangement setting information JD1 created by the feeder arrangement setting unit 347. The arrangement setting information JD1 shown in FIG. 12 is created by the feeder arrangement setting unit 347, which refers to the second specifying result information JB2 (FIG. 11) created by the feeder specifying unit 345 when creating the arrangement setting information JD1.

The arrangement setting information JD1 shown in FIG. 12 includes feeder set information JD2 and feeder arrangement related information JD3. The feeder set information JD2 is information diagrammatically showing a tape feeder arrangement state in each of the component feeding units 24A, 24B, 24C, and 24D of the component-mounting device 2. The feeder arrangement related information JD3 is information composed of set position information (set position) JD31, component type information (component name) JD32, tape type information (tape type) JD33, feeder type information (feeder type) JD34, recommended size information (recommended size) JD35, usable size information (usable size) JD36, and specified size information (specified size) JD37 that are associated with each other. The set position information JD31 is information indicating a set position defined for each component in the component feeding units 24A, 24B, 24C, and 24D. The component type information JD32 is information on the type of components stored in the component storage tape 245. The tape type information JD33 is information indicating the type of the component storage tape 245. The feeder type information JD34 is information indicating the type of the tape feeder. The recommended size information JD35 is information on the size of a tape guide 244 recommended to be used in the first tape feeder 241 adopting the first supply method. The usable size information JD36 is information on the size of a tape guide 244 that can be used in the first tape feeder 241 adopting the first supply method. The specified size information JD37 is information indicating the size of a tape guide 244 in the first tape feeder 241, the size being specified by the operator for each component.

The arrangement setting information JD1 shown in FIG. 12 demonstrates that a first tape feeder 241 whose feeder tape is indicated as "ALF" by the feeder type information JD34 is set at a set position "SA" indicated by the set position information JD31. The first tape feeder 241 of the feeder type "ALF" set at the set position "SA" is usable when the first tape feeder 241 has a tape guide 244 of a size "S" indicated by the usable size information JD36. Thus, the first tape feeder 241 having a tape guide 244 with a size "S", which is indicated by the recommended size information JD35, is recommended. The first tape feeder 241 of the feeder type "ALF" set at the set position "SA" is fitted with a component storage tape 245 of which the type is indicated as "8 mm tape" by the tape type information JD33 and which carries special components whose type is indicated as "SP1" by the component type information JD32.

The arrangement setting information JD1 demonstrates also that a second tape feeder 241A whose feeder tape is indicated as "non-ALF" by the feeder type information JD34 is set at a set position "SB" indicated by the set position information JD31. This second tape feeder 241A of the feeder type "non-ALF" set at the set position "SB" is fitted with a component storage tape 245 of which the type is indicated as "8 mm tape" by the tape type information JD33 and which carries special components whose type is indicated as "SP2" by the component type information JD32.

The arrangement setting information JD1 demonstrates also that a first tape feeder 241 whose feeder tape is indicated as "ALF" by the feeder type information JD34 is set at a set position "SC" indicated by the set position information JD31. The first tape feeder 241 of the feeder type "ALF" set at the set position "SC" is usable when the first tape feeder 241 has a tape guide 244 with a size "S/M" indicated by the usable size information JD36. Thus, the first tape feeder 241 having a tape guide 244 of the size "S", which is indicated by the recommended size information JD35, is recommended. In this case, the size of the tape guide 244 is specified as "S", as indicated in a specified size information JD37 column. The first tape feeder 241 of the feeder type "ALF" set at the set position "SC" is fitted with a component storage tape 245 of which the type is indicated as "8 mm tape" by the tape type information JD33 and which carries special components whose type is indicated as "SP3" by the component type information JD32.

The arrangement setting information JD1 demonstrates also that a second tape feeder 241A whose feeder tape is indicated as "non-ALF" by the feeder type information JD34 is set at a set position "SD" indicated by the set position information JD31. This second tape feeder 241A of the feeder type "non-ALF" set at the set position "SD" is fitted with a component storage tape 245 of which the type is indicated as "8 mm tape" by the tape type information JD33 and which carries special components whose type is indicated as "SP4" by the component type information JD32.

The arrangement setting information JD1 demonstrates also that a first tape feeder 241 whose feeder tape is indicated as "ALF" by the feeder type information JD34 is set at a set position "SE" indicated by the set position information JD31. The first tape feeder 241 of the feeder type "ALF" set at the set position "SE" is usable when the first tape feeder 241 has a tape guide 244 with a size "M/L/LL" indicated by the usable size information JD36. Thus, the first tape feeder 241 having a tape guide 244 with a size "L", which is indicated by the recommended size information JD35, is recommended. In this case, the size of the tape guide 244 is specified as "L/LL", as indicated in the specified size information JD37 column. The first tape feeder 241 of the feeder type "ALF" set at the set position "SE" is fitted with a component storage tape 245 of which the type is indicated as "8 mm tape" by the tape type information JD33 and which carries special components whose type is indicated as "SP5" by the component type information JD32.

The arrangement setting information JD1 demonstrates also that a second tape feeder 241A whose feeder tape is indicated as "non-ALF" by the feeder type information JD34 is set at a set position "SF" indicated by the set position information JD31. This second tape feeder 241A of the feeder type "non-ALF" set at the set position "SF" is fitted with a component storage tape 245 of which the type is indicated as "8 mm tape" by the tape type information JD33 and which carries components whose type is indicated as "A1" by the component type information JD32.

The arrangement setting information JD1 demonstrates also that a second tape feeder 241A whose feeder tape is indicated as "non-ALF" by the feeder type information JD34 is set at a set position "SG" indicated by the set position information JD31. This second tape feeder 241A of the feeder type "non-ALF" set at the set position "SG" is fitted with a component storage tape 245 of which the type is indicated as "8 mm tape" by the tape type information JD33 and which carries components whose type is indicated as "A2" by the component type information JD32.

According to this embodiment, the display unit 33 of the feeder management device 3 may be configured to display the arrangement setting information JD1 created by the feeder arrangement setting unit 347. The operator is thus able to carry out tape feeder pre-arrangement work, referring to the arrangement setting information JD1 displayed by the display unit 33.

Taking account of the efficiency of production of the component-mounting board by the component-mounting device 2, the feeder type changing unit 348 of the feeder selection management unit 344 changes tape feeder arrangement set by the feeder arrangement setting unit 347 into arrangement in which a tape feeder type is changed. This provides tape feeder arrangement that attaches great importance to the efficiency of production of the component-mounting board.

Figure 13:
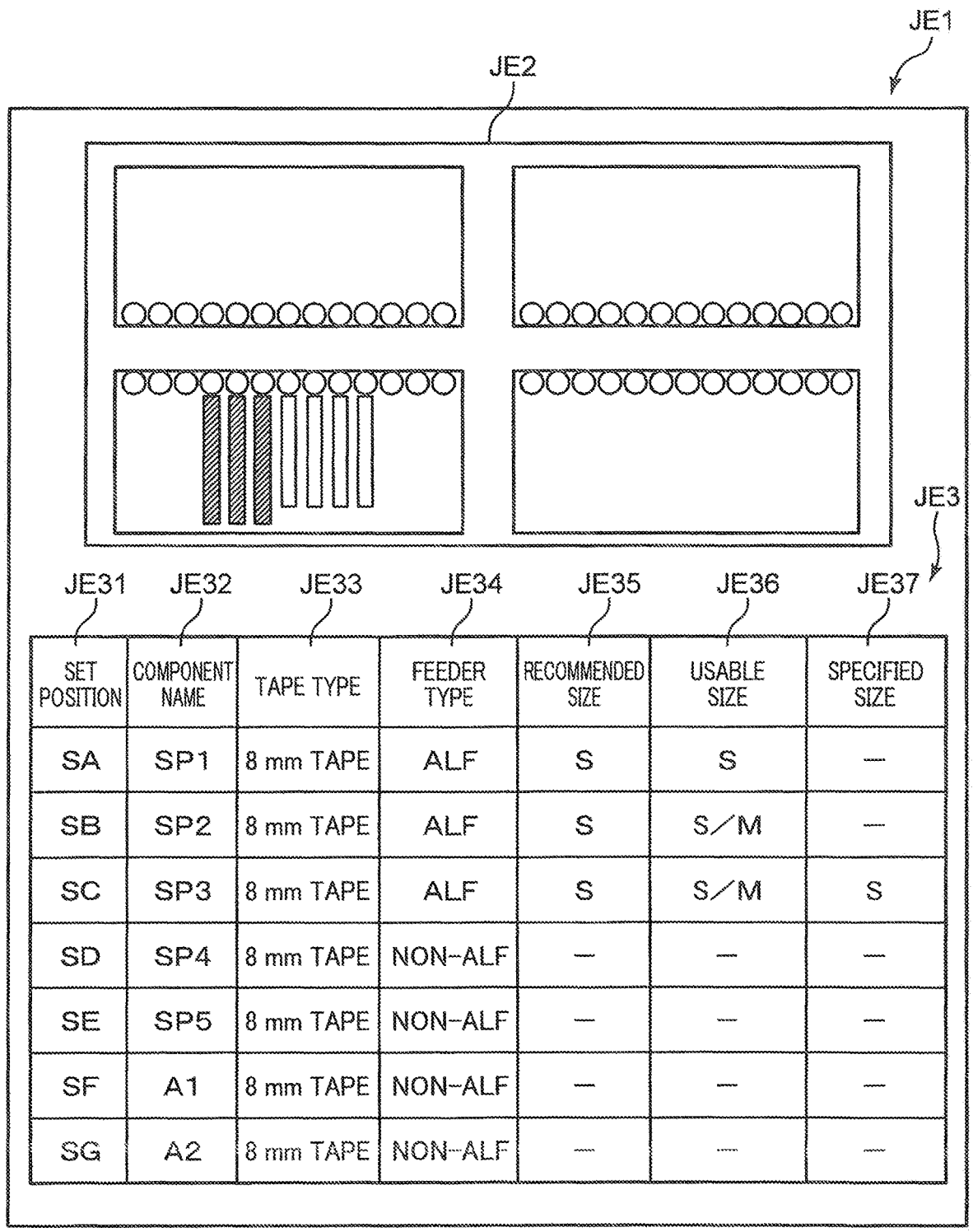
FIG. 13 is a diagram for describing type change information created by a feeder type changing unit of the feeder management device.

The feeder type changing unit 348 creates type change information indicating a result of change of a tape feeder type. Type change information created by the feeder type changing unit 348 is shown in FIG. 13. FIG. 13 is a diagram for describing type change information JE1 created by the feeder type changing unit 348. The type change information JE1 shown in FIG. 13 indicates tape feeder arrangement resulting from a change of a tape feeder type in the tape feeder arrangement indicated by the arrangement setting information JD1 (FIG. 12) created by the feeder arrangement setting unit 347.

The type change information JE1 shown in FIG. 13 includes feeder set information JE2 and feeder arrangement related information JE3. The feeder set information JE2 is information diagrammatically showing a tape feeder arrangement state in each of the component feeding units 24A, 24B, 24C, and 24D of the component-mounting device 2. The feeder arrangement related information JE3 is information composed of set position information (set position) JE31, component type information (component name) JE32, tape type information (tape type) JE33, feeder type information (feeder type) JE34, recommended size information (recommended size) JE35, usable size information JE36, and specified size information (specified size) JE37 that are associated with each other.

The type change information JE1 shown in FIG. 13 demonstrates that a tape feeder set at the set position "SB" indicated by the set position information JE31 is specified as a first tape feeder 241 whose feeder tape is indicated as "ALF" by the feeder type information JD34. It is clearly understood by comparing the type change information JE1 with the arrangement setting information JD1 that the tape feeder set at the set position "SB" has been changed in feeder type, from the second tape feeder 241A, i.e., "non-ALF", which is set by the feeder arrangement setting unit 347, to the first tape feeder 241, i.e., "ALF".

The type change information JE1 shown in FIG. 13 demonstrates also that a tape feeder set at the set position "SE" indicated by the set position information JE31 is specified as a second tape feeder 241A whose feeder tape is indicated as "non-ALF" by the feeder type information JE34. It is clearly understood by comparing the type change information JE1 with the arrangement setting information JD1 that the tape feeder set at the set position "SE" has been changed in feeder type, from the first tape feeder 241, i.e., "ALF", which is set by the feeder arrangement setting unit 347, to the second tape feeder 241A, i.e., "ALF".

According to this embodiment, the display unit 33 of the feeder management device 3 may be configured to display the type change information JE1 created by the feeder type changing unit 348. Referring to the type change information JE1 displayed by the display unit 33, the operator is able to carry out tape feeder pre-arrangement work to set tape feeder arrangement that attaches great importance to the efficiency of production of the component-mounting board.

The component-mounting system 1 according to this embodiment includes the feeder management device 3 that in a state in which various tape feeders 241 and 214A different in method of supplying the component storage tape 245 are present together, manages selection of a tape feeder that allows the operator to smoothly carry out component supply work. As a result, a case where component feeding from the tape feeder 241 or 241A stops due to a delay in component supply work can be prevented as much as possible. Hence a drop in the efficiency of production of the component-mounting board can be prevented.

The above specific embodiment mainly includes aspects of the disclosure that offer various configurations in the following manner.

A feeder management device according to one aspect of the present disclosure is a device that manages selection of a tape feeder that feeds components stored in a component storage tape, the tape feeder being to be set at each set position defined for each component in a component feeding unit of a component-mounting device that mounts components on a board to produce a component-mounting board. The feeder management device includes a memory unit that stores list information indicating, for each component, whether or not to use a tape feeder of a special type among a plurality of tape feeders different in method of supplying a component storage tape, the tape feeder of the special type supplying the component storage tape easily; and a feeder selection management unit that, referring to the list information, manages selection of a tape feeder for each component, the selection corresponding to each set position.

In a state in which various tape feeders different in method of supplying the component storage tape are present together, this feeder management device manages selection of a tape feeder to be set at each set position in the component feeding unit of the component-mounting device. The feeder selection management unit of the feeder management device refers to the list information stored in the memory unit, and manages selection of a tape feeder for each component, the selection corresponding to each set position in the component feeding unit. The list information the feeder selection management unit refers to is information indicating, for each component, whether or not to use a tape feeder of a special type among a plurality of tape feeders different in method of supplying the component storage tape, the tape feeder of the special type supplying the component storage tape easily. The feeder selection management unit thus manages selection of a tape feeder while taking account of the efficiency of component supply work for each component. As a result, in a state in which various tape feeders different in method of supplying the component storage tape are present together, a tape feeder that allows the operator to smoothly carry out component supply work can be selected. A case where a delay in component supply work causes component feeding from the tape feeder to stop and the efficiency of production of the component-mounting board drops as a consequence, therefore, can be prevented as much as possible.

In the above feeder management device, the feeder selection management unit includes a feeder specifying unit that specifies, for each component, a tape feeder suitable for component feeding corresponding to each set position, among the plurality of tape feeders, based on the list information.

In this aspect, by referring to the list information stored in the memory unit, the feeder specifying unit can specify, for each component, a tape feeder suitable for component feeding corresponding to each set position in the component feeding unit while taking account of the efficiency of component supply work.

In the above feeder management device, the plurality of tape feeders includes a tape feeder adopting a first supply method by which the tape feeder can be fitted with a plurality of component storage tapes, i.e., a preceding component storage tape that feeds components first and a component storage tape for replenishment that feeds components following component feeding by the preceding component storage tape, and a tape feeder adopting a second supply method by which the component storage tape for replenishment is spliced to a rear end of the preceding component storage tape. The tape feeder adopting the first supply method is the tape feeder of the special type.

The tape feeder adopting the first supply method is the tape feeder that can be fitted with a plurality of component storage tapes and that does not require work of splicing a component storage tape for replenishment to a preceding component storage tape. The tape feeder adopting the first supply method thus serves as the tape feeder of the special type that makes supply of the component storage tape easier than supply of the component storage tape at the tape feeder adopting the second supply method that requires splicing work.

In the above feeder management device, the feeder selection management unit further includes a priority order setting unit that, when the number of tape feeders of the special type among the plurality of tape feeders is smaller than the number of special components for which use of the tape feeder of the special type is permitted in the list information, sets a priority order of use of the tape feeder of the special type to associate the priority order with each special component. According to the priority order, the feeder specifying unit allocates the tape feeder of the special type to the special component.

When the number of the tape feeders adopting the first supply method, i.e., the tape feeders of the special type, is smaller than the number of the special components, that is, when a limit on use of the tape feeder adopting the first supply method exists, the limit arising because of the number of the tape feeders adopting the first supply method, it is necessary, in special component feeding, for which special component the tape feeder adopting the first supply method is to be used. To meet this request, the feeder specifying unit allocates the tape feeder adopting the first supply method (tape feeder of the special type) to the special component, according to the priority order set by the priority order setting unit. Thus, even when the limit on use of the tape feeder adopting the first supply method exists, the limit arising because of the number of the tape feeders adopting the first supply method, the feeder specifying unit can specify, for each component, a tape feeder suitable for component feeding corresponding to each set position in the component feeding unit.

In the above feeder management device, the priority order setting unit calculates the number of times of supply of the component storage tape for replenishment to the tape feeder adopting the first supply method, i.e., the tape feeder of the special type, the number of times of supply varying depending on the volume of production of component-mounting boards, and sets the priority order in an order of the larger number of times of supply.

In this aspect, the priority order setting unit sets the priority order of use of the tape feeder adopting the first supply method, in the order of the larger number of times of supply of the component storage tape to the tape feeder adopting the first supply method. The tape feeder adopting the first supply method is the tape feeder of the special type that makes supply of the component storage tape easier than supply of the component storage tape at the tape feeder adopting the second supply method. For this reason, even if the component storage tape is supplied frequently, that is, the frequency of component supply work is high, the operator is able to carry out component supply work without difficulty at the tape feeder adopting the first supply method. Allocating the first tape feeder adopting the first supply method in the order of the larger number of times of supply of the component storage tape, therefore, means tape feeder selection by which the operator is allowed to smoothly carry out component supply work.

The tape feeder adopting the first supply method is the tape feeder that can be fitted with a plurality of component storage tapes, i.e., a preceding component storage tape and a following component storage tape for replenishment. In the case of the tape feeder adopting the first supply method configured in such a manner, a time zone between a point of time at which the preceding component storage tape runs out of components to feed and a point of time at which the following component storage tape runs out of components to feed is a supply time zone in which a new component storage tape can be supplied. This means that the tape feeder adopting the first supply method allows choosing a proper point of time to supply a new component storage tape within the supply time zone, thus giving a high degree of freedom in supplying a new component storage tape. If respective supply time zones of a plurality of tape feeders adopting the first supply method overlap to create an overlapping supply time zone, new component storage tapes can be supplied to the tape feeders adopting the first supply method, respectively, at the same point of time within the overlapping supply time zone. Specifically, "collective supply", which allows the operator to carry out component supply work collectively, can be performed at the tape feeders that can be supplied with component storage tapes, respectively, at the same point of time. The priority order setting unit sets the priority order of use of the tape feeder adopting the first supply method that allows "collective supply", in the order of the larger number of times of supply of the component storage tape. As a result, even when the component storage tape is supplied frequently, the frequency of the operator's coming to the component-mounting device can be reduced by performing "collective supply", so that the operator's burden resulting from component supply work can be reduced.

In the feeder management device, the priority order setting unit calculates the number of times of supply, based on the number of the special components mounted on one of the component-mounting boards, or on the number of the special components mounted on the component-mounting boards produced per a unit period.

In this aspect, the priority order setting unit can calculate the number of times of supply of the component storage tape to the tape feeder adopting the first supply method, based on the number of the special components mounted on the one component-mounting board or on the number of the special components mounted on the component-mounting boards produced per the unit period.

The above feeder management device further includes a display unit that displays a specifying result information indicating a result of specifying a tape feeder for each component, the specifying result information being created by the feeder specifying unit.

In this aspect, the operator is allowed to carry out component supply work of supplying the component storage tape to the tape feeder, referring to the specifying result information displayed by the display unit.

In the above feeder management device, the feeder selection management unit further includes a feeder arrangement setting unit that sets tape feeder arrangement in the component feeding unit, referring to a result of specifying a tape feeder for each component, the result of specifying a tape feeder being given by the feeder specifying unit.

In this aspect, arrangement of tape feeders each set at each set position defined for each component in the component feeding unit of the component-mounting device corresponds to the result of specifying a tape feeder for each component, the result of specifying a tape feeder being given by the feeder specifying unit. This provides tape feeder arrangement that allows the operator to smoothly carry out component supply work.

In the above feeder management device, the feeder selection management unit further includes a feeder type changing unit that, taking account of the efficiency of production of the component-mounting board by the component-mounting device, changes tape feeder arrangement set by the feeder arrangement setting unit into arrangement in which a tape feeder type is changed.

In this aspect, taking account of the efficiency of production of the component-mounting board, the feeder type changing unit changes the tape feeder arrangement set by the feeder arrangement setting unit. This provides tape feeder arrangement that attaches great importance to the efficiency of production of the component-mounting board.

A component-mounting system according to another aspect of the present disclosure includes a component-mounting device having a component feeding unit in which a set position of a tape feeder is defined for each component, the tape feeder feeding components stored in a component storage tape; and the above feeder management device that manages selection of a tape feeder to be set at each set position.

This component-mounting system includes the feeder management device that in a state in which various tape feeders different in method of supplying the component storage tape are present together, manages selection of a tape feeder that allows the operator to smoothly carry out component supply work. As a result, a case where component feeding from the tape feeder stops due to a delay in component supply work can be prevented as much as possible. Hence a drop in the efficiency of production of the component-mounting board can be prevented.

As described above, the present disclosure provides the feeder management device that, in a state in which various tape feeders different in method of supplying the component storage tape are present together, manages selection of a tape feeder that allows the operator to smoothly carry out component supply work, and the component-mounting system provided with the feeder management device.

What is claimed is:

1. A feeder management device that manages selection of a plurality of tape feeders that each feed components stored in component storage tapes, the tape feeders to be set at each set position defined for each component in a component feeding unit of a component-mounting device that mounts components on a board to produce a component-mounting board, the tape feeders including first tape feeders and second tape feeders, the first tape feeders being a special type that supplies the component storage tape in a method different from the second tape feeders, the tape feeders of the special type each including a tape guide that guides the component storage tape, the tape guides of the tape feeders of the special type having sizes for feeding different components, the feeder management device comprising:
   a memory configured to store list information including a use permission/non-permission information and a tape guide size information that are associated with each other for each component in the component feeding unit, the use permission/non-permission information indicating, for each component, whether or not a tape feeder of the special type can be used to feed the component, the tape guide size information indicating, for each component, what size of tape guide can be used to feed the component; and
   a feeder selection manager that, referring to the list information, is configured to manage selection of a tape feeder of the plurality of tape feeders for each component, the selection corresponding to each set position, wherein the feeder selection manager is configured to select a tape feeder of the special type for supplying the component storage tapes when the use permission/non-permission information indicates that use of a tape feeder of the special type is permitted for the components and the tape guide size information of the tape feeder of the special type corresponds to the size of the component.

2. The feeder management device according to claim 1, wherein the feeder selection manager includes a feeder specifying unit configured to specify, for each component, a tape feeder suitable for component feeding corresponding to each set position, among the plurality of tape feeders, based on the list information.

3. The feeder management device according to claim 2, wherein
   the first tape feeders adopt a first supply method for fitting the tape feeder with a plurality of component storage tapes that are a preceding component storage tape that feeds components first and a component storage tape for replenishment that feeds components subsequently; and
   the second tape feeders adopt a second supply method by which the component storage tape for replenishment is spliced to a rear end of the preceding component storage tape.

4. The feeder management device according to claim 3, wherein
   the feeder selection manager further includes a priority order setting unit that, when a number of the tape feeders of the special type among the plurality of tape feeders is smaller than a number of special components for which use of the tape feeder of the special type is permitted in the list information, sets a priority order of use of the tape feeder of the special type to associate the priority order with each special component, and the feeder specifying unit allocates the tape feeder of the special type to the special component, according to the priority order.

5. The feeder management device according to claim 4, wherein the priority order setting unit is configured to calculate a number of times of supply of the component storage tape for replenishment to the tape feeder adopting the first supply method that is the tape feeder of the special type, the number of times of supply varying depending on a volume of production of the component-mounting boards, and set the priority order in an order of the larger number of times of supply.

6. The feeder management device according to claim 5, wherein the priority order setting unit is configured to calculate the number of times of supply, based on a number of the special components mounted on one of the component-mounting boards, or on a number of the special components mounted on the component-mounting boards produced per a unit period.

7. The feeder management device according to claim 6, further comprising a display configured to display specifying result information indicating a result of specifying a tape feeder for each component, the specifying result information being created by the feeder specifying unit.

8. The feeder management device according to claim 6, wherein the feeder selection manager further includes a feeder arrangement setting unit configured to set tape feeder arrangement in the component feeding unit, referring to a result of specifying a tape feeder for each component, the result of specifying a tape feeder being given by the feeder specifying unit.

9. The feeder management device according to claim 5, further comprising a display configured to display specifying result information indicating a result of specifying a tape feeder for each component, the specifying result information being created by the feeder specifying unit.

10. The feeder management device according to claim 5, wherein the feeder selection manager further includes a feeder arrangement setting unit configured to set tape feeder arrangement in the component feeding unit, referring to a result of specifying a tape feeder for each component, the result of specifying a tape feeder being given by the feeder specifying unit.

11. The feeder management device according to claim 4, further comprising a display configured to display specifying result information indicating a result of specifying a tape feeder for each component, the specifying result information being created by the feeder specifying unit.

12. The feeder management device according to claim 4, wherein the feeder selection manager further includes a feeder arrangement setting unit configured to set tape feeder arrangement in the component feeding unit, referring to a result of specifying a tape feeder for each component, the result of specifying a tape feeder being given by the feeder specifying unit.

13. The feeder management device according to claim 3, further comprising a display configured to display specifying result information indicating a result of specifying a tape feeder for each component, the specifying result information being created by the feeder specifying unit.

14. The feeder management device according to claim 3, wherein the feeder selection manager further includes a feeder arrangement setting unit configured to set tape feeder arrangement in the component feeding unit, referring to a result of specifying a tape feeder for each component, the result of specifying a tape feeder being given by the feeder specifying unit.

15. The feeder management device according to claim 2, further comprising a display configured to display specifying result information indicating a result of specifying a tape feeder for each component, the specifying result information being created by the feeder specifying unit.

16. The feeder management device according to claim 15, wherein the feeder selection manager further includes a feeder arrangement setting unit configured to set tape feeder arrangement in the component feeding unit, referring to a result of specifying a tape feeder for each component, the result of specifying a tape feeder being given by the feeder specifying unit.

17. The feeder management device according to claim 2, wherein the feeder selection manager further includes a feeder arrangement setting unit configured to set tape feeder arrangement in the component feeding unit, referring to a result of specifying a tape feeder for each component, the result of specifying a tape feeder being given by the feeder specifying unit.

18. The feeder management device according to claim 17, wherein the feeder selection manager further includes a feeder type changing unit that, taking account of efficiency of production of the component-mounting board by the component-mounting device, is configured to change tape feeder arrangement set by the feeder arrangement setting unit into arrangement in which a tape feeder type is changed.

19. A component-mounting system comprising:
a component-mounting device having a component feeding unit in which a set position of a tape feeder is defined for each component, the tape feeder feeding components stored in a component storage tape; and
the feeder management device according to claim 1, the feeder management device managing selection of a tape feeder to be set at each set position.

20. A component-mounting system comprising:
a component-mounting device having a component feeding unit in which a set position of a tape feeder is defined for each component, the tape feeder feeding components stored in a component storage tape; and
the feeder management device according to claim 2, the feeder management device managing selection of a tape feeder to be set at each set position.

* * * * *